(12) United States Patent
Conti et al.

(10) Patent No.: US 11,894,802 B2
(45) Date of Patent: Feb. 6, 2024

(54) SOLAR MODULE RACKING SYSTEM

(71) Applicant: Conti SPE, LLC, Summit, NJ (US)

(72) Inventors: Kurt G. Conti, New Providence, NJ (US); Cullin J. Wible, Austin, TX (US)

(73) Assignee: CONTI INNOVATION CENTER, LLC, Orlando, FL (US)

( * ) Notice: Subject to any disclaimer, the term of this patent is extended or adjusted under 35 U.S.C. 154(b) by 0 days.

(21) Appl. No.: 17/841,239

(22) Filed: Jun. 15, 2022

(65) Prior Publication Data
US 2022/0407452 A1    Dec. 22, 2022

Related U.S. Application Data

(60) Provisional application No. 63/211,262, filed on Jun. 16, 2021.

(51) Int. Cl.
| H02S 30/10 | (2014.01) |
| H02S 50/10 | (2014.01) |
| H01L 31/043 | (2014.01) |
| H01L 31/05 | (2014.01) |

(Continued)

(52) U.S. Cl.
CPC ............ H02S 30/10 (2014.12); F16M 11/18 (2013.01); H01L 31/043 (2014.12); H01L 31/0547 (2014.12); H02S 50/10 (2014.12)

(58) Field of Classification Search
CPC ....... H02S 30/10; H02S 50/10; H01L 31/043; H01L 31/0547
See application file for complete search history.

(56) References Cited

U.S. PATENT DOCUMENTS

| 4,909,857 A | 3/1990 | Ondris et al. |
| 5,261,969 A | 11/1993 | Stanbery |
| 5,922,142 A | 7/1999 | Wu et al. |

(Continued)

FOREIGN PATENT DOCUMENTS

| CN | 109037390 | 12/2018 |
| CN | 107341566 B | 7/2020 |

(Continued)

OTHER PUBLICATIONS

International Search Report and Written Opinion for Application No. PCT/US2022/033603 dated Sep. 28, 2022.

(Continued)

*Primary Examiner* — Jayne L Mershon
(74) *Attorney, Agent, or Firm* — Volpe Koenig

(57) ABSTRACT

A solar module racking system including a frame. The frame includes pre-wired receptacles for rapid assembly of solar modules. The frame receives and mechanically supports each solar module. The frame arranges the solar modules in a first planar direction, in a second planar direction, and in a vertical direction that is normal to the first and second planar directions. Each pre-wired receptacles individually and electrically connect each of the solar modules after insertion of that module into the frame. The solar module racking system provides a 2 by 1 by 1 configuration or a 1 by 2 by 1 configuration for the plurality of solar modules corresponding to the first planar direction, the second planar direction, and the vertical direction. A first module and a second module are arranged in the first planar direction or the second planar direction, respectively.

14 Claims, 18 Drawing Sheets

(51) Int. Cl.
   *F16M 11/18*  (2006.01)
   *H01L 31/054*  (2014.01)

(56) References Cited

U.S. PATENT DOCUMENTS

| | | | |
|---|---|---|---|
| 8,124,870 B2 | 2/2012 | Woods et al. |
| 8,224,189 B1 | 7/2012 | Frolov |
| 8,298,856 B2 | 10/2012 | Garnett |
| 8,448,898 B1 | 5/2013 | Frolov et al. |
| 8,455,808 B1 | 6/2013 | Frolov et al. |
| 8,461,504 B1 | 6/2013 | Frolov et al. |
| 8,746,620 B1 | 6/2014 | Moussouris et al. |
| 8,897,770 B1 | 11/2014 | Frolov et al. |
| 9,054,245 B2 | 6/2015 | Feldman-Peabody et al. |
| 9,123,838 B2 | 9/2015 | Fogel et al. |
| 9,269,849 B2 | 2/2016 | Yu et al. |
| 9,306,107 B2 | 4/2016 | Hong et al. |
| 9,391,700 B1 | 7/2016 | Bruce et al. |
| 9,570,795 B1 | 2/2017 | Bruce et al. |
| 9,698,285 B2 | 7/2017 | Damjanovic et al. |
| 9,758,257 B1 | 9/2017 | Frolov et al. |
| 9,841,616 B1 | 12/2017 | Bruce et al. |
| 9,853,177 B2 | 12/2017 | Yu et al. |
| 9,969,893 B2 | 5/2018 | Kim et al. |
| 10,505,240 B1 | 12/2019 | Bruce et al. |
| 10,529,883 B2 | 1/2020 | Damjanovic et al. |
| 11,042,047 B1 | 6/2021 | Bruce et al. |
| 2004/0118451 A1 | 6/2004 | Walukiewicz |
| 2005/0012113 A1 | 1/2005 | Sheu et al. |
| 2006/0180197 A1 | 8/2006 | Gui et al. |
| 2008/0216885 A1 | 9/2008 | Frolov et al. |
| 2009/0078318 A1 | 3/2009 | Meyers et al. |
| 2009/0146501 A1 | 6/2009 | Cyrus |
| 2009/0211622 A1 | 8/2009 | Frolov et al. |
| 2009/0215215 A1 | 8/2009 | Frolov et al. |
| 2009/0218651 A1 | 9/2009 | Frolov et al. |
| 2009/0221111 A1 | 9/2009 | Frolov et al. |
| 2009/0250096 A1 | 10/2009 | Pan |
| 2009/0250722 A1 | 10/2009 | Bruce et al. |
| 2009/0255567 A1 | 10/2009 | Frolov et al. |
| 2009/0308437 A1 | 12/2009 | Woods et al. |
| 2010/0015753 A1 | 1/2010 | Garnett |
| 2010/0059101 A1 | 3/2010 | Shinohara |
| 2010/0084924 A1 | 4/2010 | Frolov et al. |
| 2010/0089441 A1 | 4/2010 | Frolov et al. |
| 2010/0098854 A1 | 4/2010 | Bruce et al. |
| 2010/0129957 A1 | 5/2010 | Frolov et al. |
| 2010/0170556 A1 | 7/2010 | Frolov et al. |
| 2010/0212714 A1 | 8/2010 | Rothschild et al. |
| 2010/0229923 A1 | 9/2010 | Frolov et al. |
| 2010/0233843 A1 | 9/2010 | Frolov et al. |
| 2010/0288335 A1 | 11/2010 | Frolov et al. |
| 2010/0294346 A1 | 11/2010 | Frolov et al. |
| 2010/0294354 A1 | 11/2010 | Frolov et al. |
| 2010/0314238 A1 | 12/2010 | Frolov et al. |
| 2011/0024724 A1 | 2/2011 | Frolov et al. |
| 2011/0067757 A1 | 3/2011 | Frantz et al. |
| 2011/0143489 A1 | 6/2011 | Korevaar |
| 2012/0019074 A1 | 1/2012 | Frolov et al. |
| 2012/0060923 A1 | 3/2012 | Zhao et al. |
| 2012/0097222 A1 | 4/2012 | Gessert et al. |
| 2012/0145240 A1 | 6/2012 | Carcia |
| 2012/0233940 A1 | 9/2012 | Perkins et al. |
| 2013/0230944 A1 | 9/2013 | Feldman-Peabody et al. |
| 2014/0000692 A1 | 1/2014 | Fogel et al. |
| 2014/0196761 A1 | 7/2014 | Tilley et al. |
| 2014/0216534 A1 | 8/2014 | Hong et al. |
| 2014/0216542 A1 | 8/2014 | Shao et al. |
| 2014/0216550 A1 | 8/2014 | Damjanovic et al. |
| 2014/0264988 A1 | 9/2014 | Bekele et al. |
| 2014/0284750 A1 | 9/2014 | Yu et al. |
| 2014/0302178 A1 | 10/2014 | Polansky |
| 2015/0097071 A1 | 4/2015 | Frolov et al. |
| 2015/0097079 A1 | 4/2015 | Frolov et al. |
| 2015/0122947 A1 | 5/2015 | Bruce et al. |
| 2015/0171260 A1 | 6/2015 | Liu et al. |
| 2016/0060468 A1 | 3/2016 | Kim et al. |
| 2016/0126395 A1 | 5/2016 | Damjanovic et al. |
| 2016/0126397 A1 | 5/2016 | Yu et al. |
| 2016/0344330 A1 | 11/2016 | Gillis |
| 2016/0363938 A1 | 12/2016 | Frolov et al. |
| 2017/0040933 A1 | 2/2017 | Vogel |
| 2018/0001975 A1 | 1/2018 | Jaramillo |
| 2018/0054156 A1 | 2/2018 | Lokey |
| 2018/0317289 A1 | 11/2018 | Frolov et al. |
| 2019/0115974 A1 | 4/2019 | Frolov et al. |
| 2019/0181793 A1 | 6/2019 | Azad et al. |
| 2019/0296174 A1 | 9/2019 | Gloeckler et al. |
| 2020/0052643 A1* | 2/2020 | Ballentine ............ F16M 11/10 |
| 2020/0106518 A1 | 4/2020 | Frolov et al. |
| 2022/0085226 A1 | 3/2022 | Okumura et al. |

FOREIGN PATENT DOCUMENTS

| | | | |
|---|---|---|---|
| DE | 102011087672 | * | 8/2012 |
| DE | 102011087672 A1 | | 8/2012 |
| DE | 102011089916 A1 | | 6/2013 |
| WO | 2009/105683 | | 8/2009 |
| WO | 2018/071509 | | 4/2018 |
| WO | 2018/085829 | | 5/2018 |
| WO | 2020246074 A1 | | 12/2020 |

OTHER PUBLICATIONS

International Search Report and Written Opinion for Application No. PCT/US2022/033612 dated Sep. 23, 2022.

International Search Report and Written Opinion for Application No. PCT/US2022/033659 dated Oct. 5, 2022.

Spanias Andreas S: "Solar energy management as an Internet of Things (IoT) application", 2017 8th International Conference on Information, Intelligence, Systems & Application (IISA), IEEE, Aug. 27, 2017 (Aug. 27, 2017), pp. 1-4, XP033331189, DOI: 10.1109/IISA.2017.8316460 [retrieved on Mar. 14, 2018] p. 1, right-hand column, p. 1, right-hand column, paragraph 4—p. 3, left-hand column, paragraph 1; figures 2,4.

Viera et al. "A Comprehensive Review on Bypass Diode Application on Photovoltaic Modules" Energies 13, No. 10: 2472 (2020).

Comprehensive Guide on Organic and Inorganic Solar Cells, Fundamental Concepts to Fabrication Methods, 1st Edition (Nov. 16, 2021).

Subedi et al., "Enabling bifacial thin film devices by developing a back surface field using CuxAlOy". United States (2021).

Hall et al., Back contacts materials used in thin film CdTe solar cells—A review. Energy Sci Eng. 2021; 9: 606-632 (2021).

Liu et al., "High-Efficiency Isolated Photovoltaic Microinverter using Wide-Band Gap Switches for Standalone and Grid-Tied Applications" Energies 11, No. 3: 569 (2018).

Materials for Solar Energy Conversion: Materials, Methods and Applications, R. Rajasekar (Editor), C. Moganapirya (Editor), A. Mohankumar (Editor), ISBN: 978-1-119-75060-4 (Nov. 2021).

Subedi et al., "Nanocomposite (CuS)x(ZnS)1-x Thin Film Back Contact for CdTe Solar Cell: Toward a Bifacial Device," (2018).

Bauwens et al., "NMOS-Based Integrated Modular Bypass for Use in Solar Systems (NIMBUS): Intelligent Bypass for Reducing Partial Shading Power Loss in Solar Panel Applications" Energies 9, No. 6: 450 (2016).

Prism Solar Data Sheet, BN72 Bifacial Modules, 72—Cell Bifacial Series BN72—370, Available at: https://static1.squarespace.com/static/57a12f5729687f4a21ab938d/t/5e509ebbdbfcb2688ef27902/1582341820082/Prism+Solar++BN72++Gen2+-+360-370W++1.2.pdf (2020).

Non-Final Office Action for U.S. Appl. No. 17/841,218 dated Feb. 16, 2023.

International Preliminary Report on Patentability received in related international application No. PCT/US2022/033659, dated Jul. 25, 2023, 35 pages.

* cited by examiner

US 11,894,802 B2

SOLAR MODULE RACKING SYSTEM

CROSS REFERENCE TO RELATED APPLICATIONS

This application claims priority from U.S. Provisional Patent Application No. 63/211,262, entitled "MODULAR SOLAR SYSTEM," filed on Jun. 16, 2021, which is hereby incorporated by reference as if set forth in full in this application for all purposes.

FIELD OF INVENTION

The disclosure herein is related to solar power generation by a modular solar system. More particularly, the disclosure herein include solar module racking system for solar power generation.

BACKGROUND

Currently, there are no economically viable techniques for conventional photovoltaic solar cells to achieve power conversion efficiencies greater than 25%. As a result, at least 75% of the sun's energy hitting earth's surface is unused.

SUMMARY

According to one or more embodiments, a solar module racking system including a frame. The frame includes a plurality of pre-wired receptacles for rapid assembly of a plurality of solar modules. The frame receives and mechanically supports each module of the plurality of solar modules. The frame arranges the plurality of solar modules in a first planar direction, in a second planar direction, and in a vertical direction that is normal to the first and second planar directions. Each of plurality of pre-wired receptacles individually and electrically connect each of the plurality of solar modules after insertion of that module into the frame. The solar module racking system provides at least a 2 by 1 by 1 configuration or a 1 by 2 by 1 configuration for the plurality of solar modules corresponding to the first planar direction, the second planar direction, and the vertical direction. A first module and a second module are arranged in the first planar direction or the second planar direction, respectively.

According to one or more embodiments, a solar module racking system including a frame. The frame includes a plurality of pre-wired receptacles for rapid assembly of a plurality of solar modules. The frame receives and mechanically supports each module of the plurality of solar modules. The frame arranges the plurality of solar modules in a first planar direction, in a second planar direction, and in a vertical direction that is normal to the first and second planar directions. Each of plurality of pre-wired receptacles individually and electrically connect each of the plurality of solar modules after insertion of that module into the frame. The solar module racking system provides at least a 1 by 1 by 2 configuration for the plurality of solar modules corresponding to the first planar direction, the second planar direction, and the vertical direction where at least a first module and a second module are arranged and mechanically stacked in the vertical direction.

Additional features and advantages are realized through the techniques of the present disclosure. Other embodiments and aspects of the disclosure are described in detail herein.

For a better understanding of the disclosure with the advantages and the features, refer to the description and to the drawings.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Disclosed herein is a modular solar system. More particularly, the modular solar system relates to a solar module racking system for solar power generation that stacks multiple transparent solar modules within a framework/cartridge to absorb different solar energy as sunlight passes through levels of the framework/cartridge. Further, the framework/cartridge is one of a plurality of frameworks/cartridges that are coupled and/or placed within one or more frames. The modular solar system can be connected to a load, such as a power grid, to provide solar power generated by the transparent solar modules thereto. According to one or more technical effects, advantages, and benefits, the modular solar system achieves an overall solar power conversion efficiency per square meter that is greater than the 25% of conventional photovoltaic solar cells.

Figure 1:
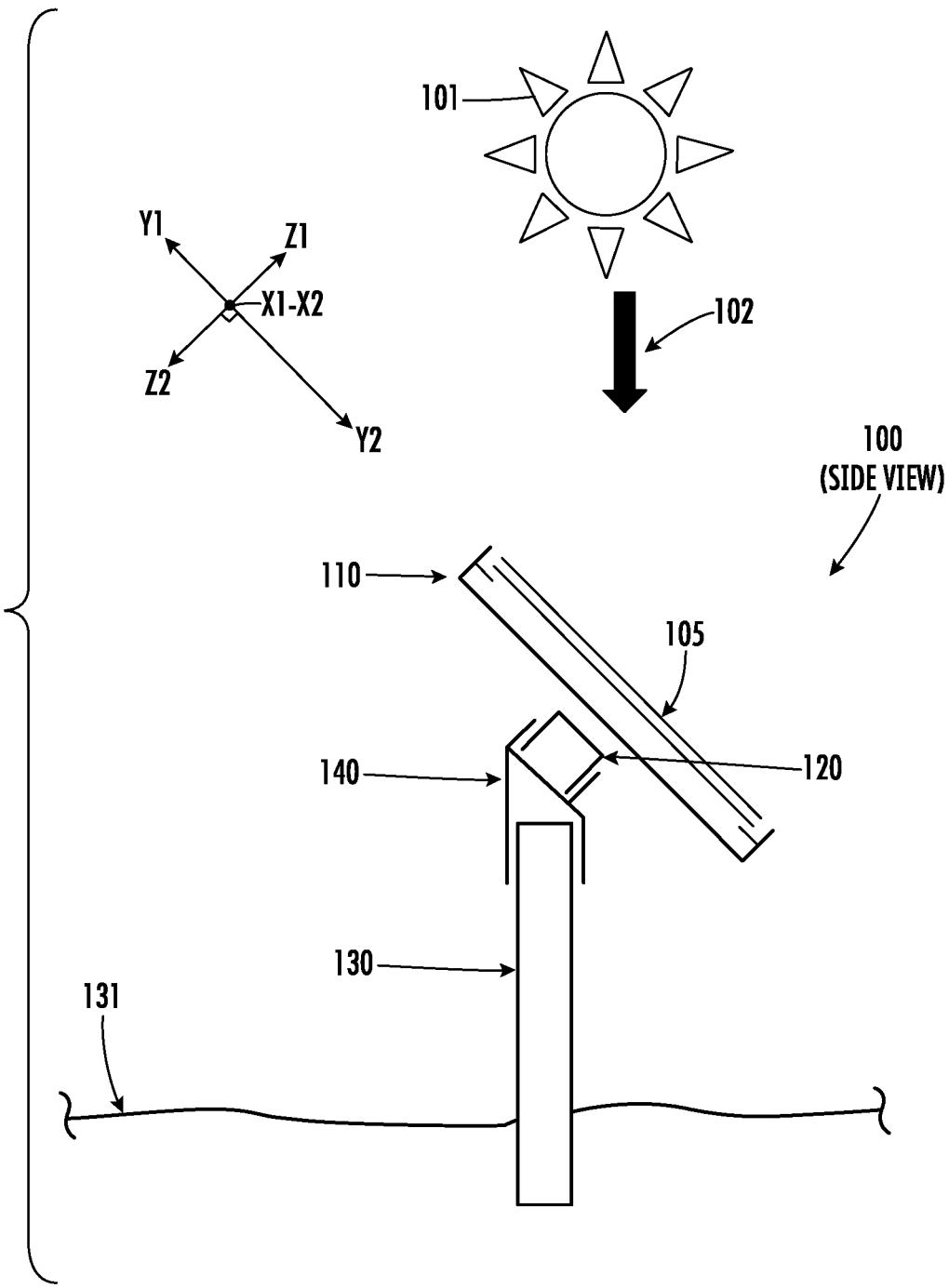
FIG. 1 depicts a system according to one or more embodiments.

FIG. 1 depicts a system 100 according to one or more embodiments. The system 100 is an example of the solar module racking system as described herein. The diagram of FIG. 1 is oriented according to an X1-X2 axis, a Y1-Y2 axis, and Z1-X2 axis. The X1-X2 axis, as represented as a dot/circle, is generally oriented into and out of the page or normal to a Y-Z plane. The Y1-Y2 axis is generally oriented in a direction normal to an X-Z plane. The Z1-Z2 axis is generally oriented in a direction normal to an X-Y plane. The X1 direction is opposite the X2 direction, the Y1 direction is opposite the Y2 direction, and the Z1 direction is opposite the Z2 direction. Other orientations can be made in accordance with these axes, which may be tilted or angled. References to a side or a surface of a component can be described in accordance with these axes. For instance, a reference to a lower or bottom side or a downwardly facing surface of a component described may be referred to as a Z2 side or a Z2 surface.

The system 100 receives, from at least a sun 101 (from the Y1-Z1 direction), light energy or light 102. The light 102 can be considered incident light or natural light (though other sources are contemplated). The system 100 receives the light 102 at a plurality of solar modules 105. The system 100 includes a frame 110 (e.g., a framework or stacking structure), a beam arrangement 120, a post 130, and a cap 140.

The frame 110 can include a plurality of pre-wired receptacles for rapid assembly of the plurality of solar modules. The frame 110 can receive and mechanically support each module of the plurality of solar modules 105 upon insertion of that module into the frame 110. The frame 110 can receive and individually electrically connect each module of the plurality of solar modules 105 upon insertion into a corresponding pre-wired receptacle. Example of mechanical stacking includes, but are not limited to, horizontal stacking, parallel stacking with a plane of a horizon (i.e., flat to the earth), and parallel stacking with a plane of an array (i.e., design determined).

The frame 110 is configured to arrange the plurality of solar modules 105 in a first planar direction (e.g., the X1-X2 axis), in a second planar direction (e.g., the Y1-Y2 axis), and/or in a vertical direction (e.g., the Z1-Z2 axis) that is normal to the first and second planar directions. The system 100 can provide at least a 2 by 1 by 1 configuration for the plurality of solar modules 105, where at least a first module and a second module are arranged in the first planar direction. The frame 110 can mechanically support and stack at least a third module of the plurality of solar modules 105 with one of the first or second modules in the vertical direction. According to one or more embodiments, the frame 110 can include L-channel supports with wire management. The frame 110 can receive a top loading of the plurality of solar modules 105. The system 100 can include a reflective module/layer below the frame 110, as part of the frame 110, and/or as a module within the frame 110. At least one of the plurality of solar modules 105 can include at least one solar cell configured to convert at least part of the unconverted portions of the light 102 into electricity.

According to one or more embodiments, and as further described herein, the frame 110 can include one or more arms configured to minimize internal shading onto the plurality of solar modules 105. Further, the frame 110 can includes a slot and shelving system, a rail clamp system, a snap button and slot system, and/or a tracking system for receiving the plurality of solar modules 105. Furthermore, the frame 110 can include a perimeter mold along an outer edge of the each of the at least two mechanically stacked solar modules 105, each perimeter mold configured to stack with an adjacent perimeter mold. The frame 110 can be sealed on a perimeter of the at least two mechanically stacked solar modules 105 by a gap filler and a glue. The frame 110 can be sealed on a perimeter of the at least two mechanically stacked solar modules 105 by a screen, a water tight membrane, or an air filter.

The beam arrangement 120 can include at least one beam to support the frame 110. The beam arrangement 120 can also support a plurality of the frames 110 to provide at least a 2 by 2 by 1 configuration for the plurality of solar modules 105. The at least one beam of the beam arrangement 120 can be square beams, round beams, I-beams, or other structural member with variable angles. According to one or more embodiments, the beam arrangement 120 can include C-channel supports with wire management.

The post 130 mounted to a surface (i.e., a ground 131). The post 130 can be a square beam, round pipe, channel member, or I-beam fixed to, mounted on, and/or partially buried in the ground or other surface. The cap 140 can be mechanically coupled to the post 130 and configured to accept the beam arrangement. The cap 140 can be a post cap for the post 130, and include a U-bracket set to an angle from the post 130 as shown in FIG. 1.

Figure 2:
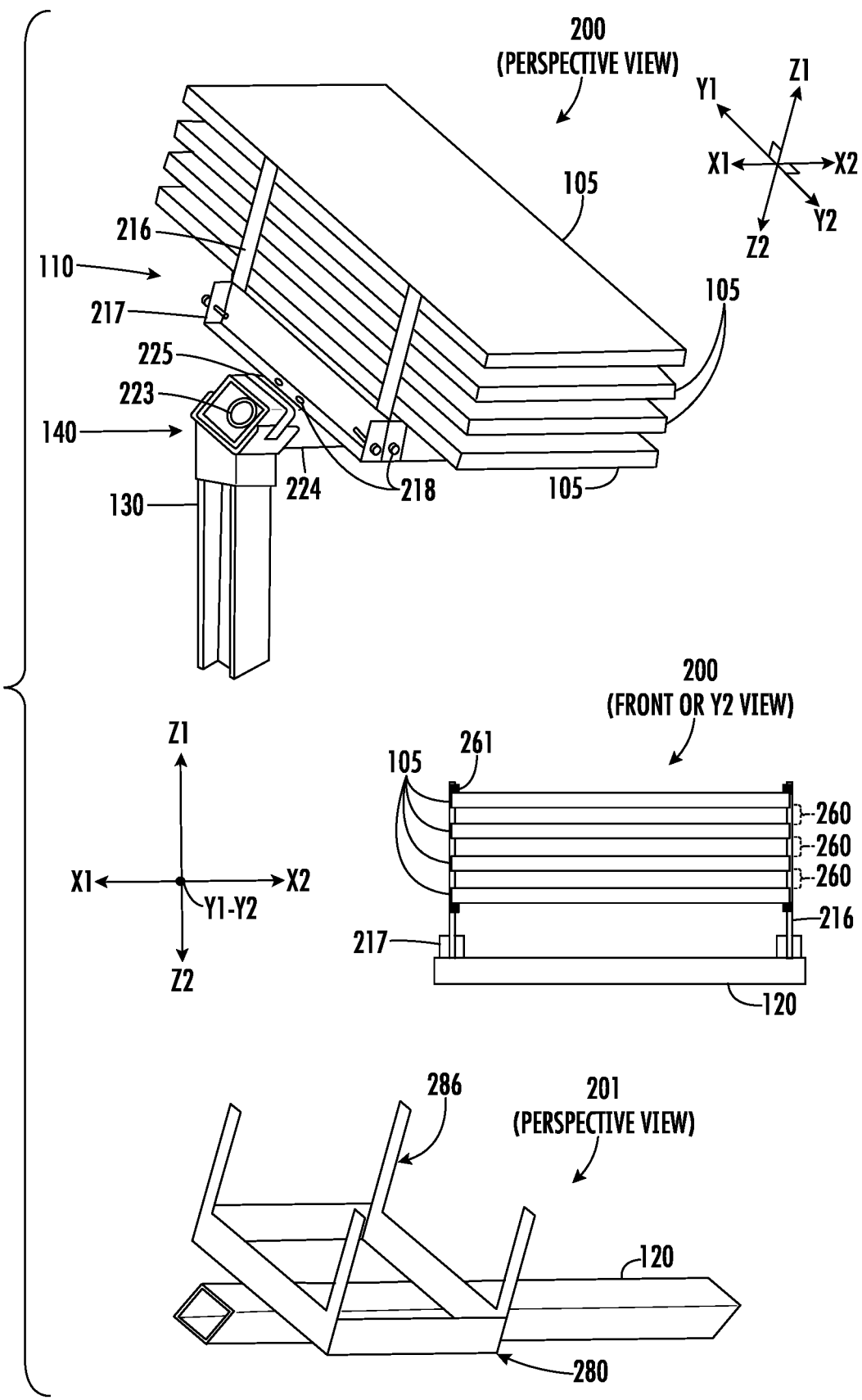
FIG. 2 depicts examples of a system according to one or more embodiments.

FIG. 2 depicts examples of a system 200 according to one or more embodiments. Note that, by way of example in conjunction with the other drawings, like reference numerals in the figures indicate like elements and will not be reintroduced for brevity. The system 200 is shown from a perspective view and a front view through side walls thereof. Additionally, an alternative illustration of the system 200 is depicted as system 201 (without any solar modules 105 therein). The system 200 includes the frame 110 including one or more arms 216 and one or more holders 217. The system 200 also includes one or more fasteners 218 (e.g., cotter pins and/or screws), a conduit 223 inside a beam 224 within the beam arrangement 120, and one or more straps 225.

The one or more holders 217 secure the one or more arms 216 in place. The one or more holders 217 can be secured by the fasteners 218 to the arms 218 and to the beam arrangement 120. The beam arrangement 120 can be one or more beams or at least the one beam 224. The beam arrangement 720 supports the one or more frames 110 that further support one or more solar modules 105 as discussed herein. In this regard, the one or more solar modules 105 can be mounted within the arms 216 of the system 200 of FIG. 2, so that the one or more solar modules 105 are mechanically stacked in an adjacent and/or proximate configuration.

The strap 225 can be adjustable to keep the beam arrangement 120 or the beam 224 in place on the cap 130. The conduit 223 can house electrical wiring, such as strings as described herein. According to one or more embodiments, the beam arrangement 120 can provide a C-channel support with wire management (e.g., conduit 223), such that electrical wiring can be placed directly in the conduit 223.

According to one or more embodiments, the system 200 secures a mechanical stacking of the solar modules 105 (e.g., thereby providing an alternative design to tandem cells by way of a mechanically stacked configuration that is not bonded). According to one or more embodiments, the one or more frames 110 is a snap button and slot system or perimeter mold system where the arms 216 and the holders 217 secure or clamp the solar modules 105 into place. The holders 217 can be spacer clamps for the arms 216, which hold the solar modules 105 in a vertical stack (e.g., the Z direction), with interim sections 260 as described herein. The system 200 can includes wedges 261 to maintain the one or more solar modules 105 in place within the arms 216. The wedges 261 can correspond to each solar module 105. The wedges 261 can be clear and/or rubber components, as well as metal or plastic, that support the insertion of the solar modules 105. According to one or more embodiments, the perimeter mold system can include a perimeter mold along an outer edge of each of the solar modules 105, each perimeter mold configured to stack with an adjacent perimeter mold. The system 200 can also include wedges, such as rubber wedges to keep the beam 120 in place within the cap 140. Note that any component of the system 200, as well as the solar modules 105, can be shipped separately and assembled in the field. Further, as shown in system 201, the frame 110 can also be a continuous structure that includes a base portion 280 and arm portions 286.

According to one or more embodiments, the interim sections 260 can be an area of the system 200 where the solar modules 105 are adjacent. Adjacent in this context includes two components being next to, in contact with, or adjoining (e.g., effectively touching) without being bonded together, as well as being stacked directly on top of each other. The interim sections 260 can be maintained by a seal or the like on a perimeter of the solar modules 105. The seal can include, but is not limited to, one or more of a glue or other adhesive, a gasket, a plastic member, and a gap filler. According to one or more embodiments, the seal is a combination of a gap filler and a glue or other adhesive. According to one or more embodiments, the interim sections 260 are sealed on a perimeter to support the mechanical stacking of the solar modules 105, as well as to prevent foreign objects (e.g., dust, insects, rodents, or the like) from penetrating between the solar modules 105.

According to one or more embodiments, the interim sections 260 can be an area of the system 200 where the solar modules 105 are proximate to each other to form a space therebetween. Proximate in this context includes two components being near, close to, or at some predefined distance without being bonded together. Examples of proximate can include, but are not limited to, 1 millimeter, 5 millimeter, 1 centimeter, 5 centimeters, 1 decimeter, 5 decimeters, or the like. Any space (i.e., the interim section 260) can be maintained by a seal as described herein and/or by the system 200. According to one or more embodiments, the system 200 supports and secures the mechanical stacking of the solar modules 105, as well as provides the seal on one or more sides of the solar modules 105. Examples of the seal can also include, but are not limited to, a screen, a water tight membrane, or an air filter.

Each of the solar modules 105 of the system 200 can be transmissive.

Figure 3:
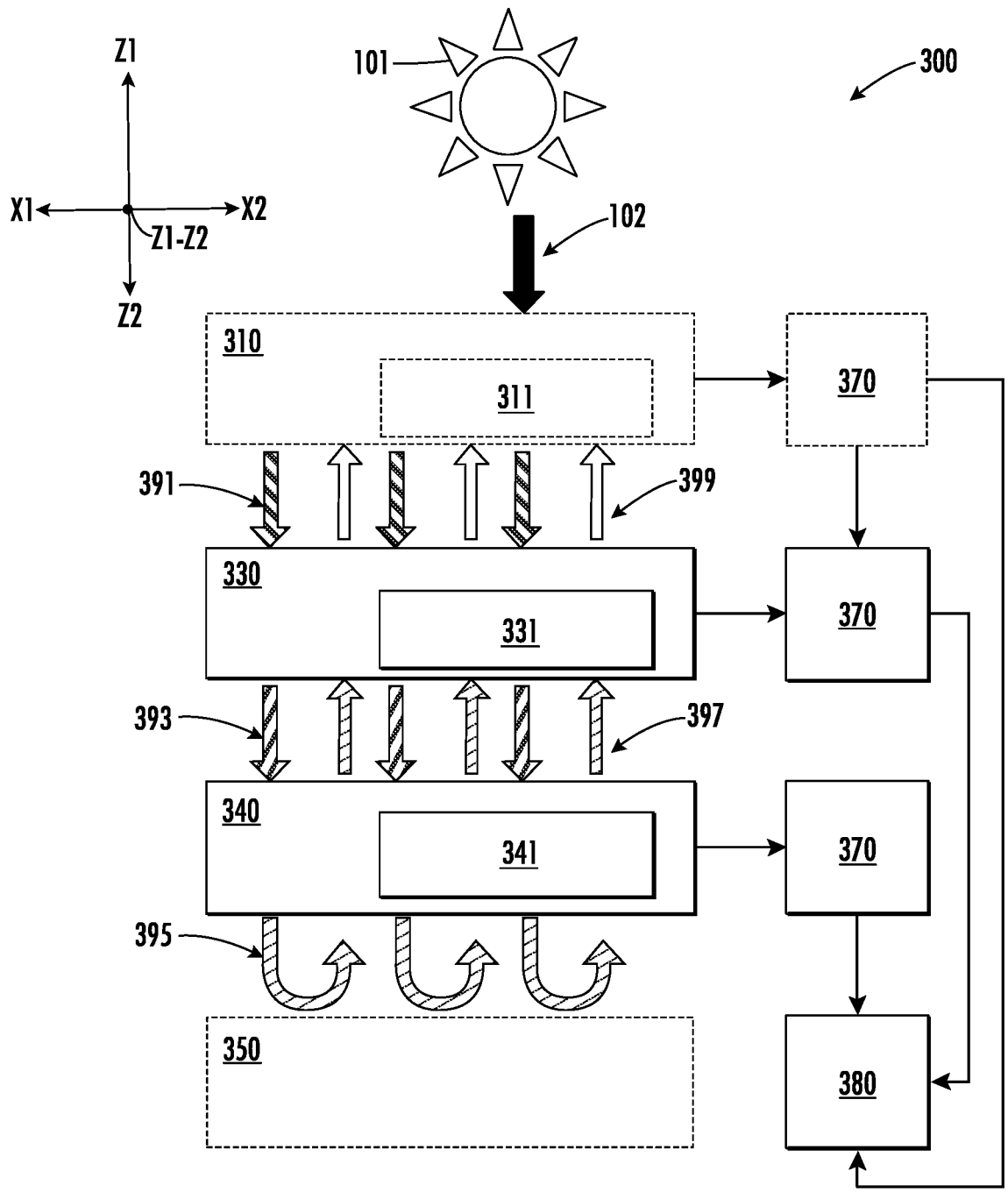
FIG. 3 depicts a system according to one or more embodiments.

FIG. 3 depicts a system 300 according to one or more embodiments. The system 300 receives, from at least the sun 101, the light 102 (though other sources are contemplated). The system 300 includes an optional module 310, with an optional transmissive solar cell 311; a transmissive module 330, with a transmissive solar cell 331; a module 340, with a solar cell 341 that can be optionally transmissive (e.g., the module 340 can be a transmissive module); an optional reflective module 350; one or more boxes 370, and a bus 380. Note that the optionality of any component or any feature is shown with a dotted border. The optional module 310 can be a concentrator, micro-concentrator, or a transmissive module. Each module is connected to the one or more boxes 370, which can be electrical combiner boxes (e.g., corresponding to strings of a support structures as described herein) that provide electricity generated by the one or more modules 310, 330, and 340 to the bus 380 (e.g., the PV bus connector and the PV connector box).

The one or more boxes 370 can be hard wired electrical connections that provide outlets, connections, or the like for receiving the one or more modules 310, 330, and 340. Note that the hard wired electrical connections can contain sensors, and the hard wired electrical connections can join wiring from separate modules. For example, each wiring harnesses of a module can protrude to a backside of each outlet to make installation, repairs, and maintenance easy (e.g., in a plug and play fashion). These hard wired electrical connections and outlets can be weatherproof quick connection hardware (e.g., used to connect wires to combiner boxes to simplify installation and reduce field quality errors). Fuses with in-use indication lights can be included with each hard wired electrical connection to ensure the modules are de-energized during installation and maintenance. Additionally, the operations of the system 300 can be monitored by one or more sensors as described herein.

The system 300 is an example of a modular solar system. More particularly, the system 300 is an example of mechanically stacked solar transmissive cells or modular apparatus. According to one or more embodiments, the system 300 includes at least two mechanically stacked modules, such as the optional module 310, the transmissive module 330, and the module 340. According to one or more embodiments, the optional module 310, the transmissive module 330, and the module 340 can be bi-facial (e.g., absorb light energy from either side) and include clear wiring to enable light energy to make multiple passes therethrough. The optional module 310 and the transmissive module 330 can be representative of one or more upper modules. The module 340 can be representative of a module layer, which can be the same or different from the one or more upper modules. The optional module 310 and the transmissive module 330 includes a plurality of transmissive solar cells (e.g., the optional transmissive solar cell 311 and the transmissive solar cell 331), which convert light energy received on a Y2 side (or a sun or first side) into electricity and pass unconverted portions of the light energy to a next module. For instance, the optional module 310 passes in a Y1 direction unconverted portions of the light energy to the transmissive module 330 on a Y2 side (or a sun or second side) of the optional module 310. Further, the transmissive module 330 passes in a Y1 direction unconverted portions of the light energy to the module 340 on a Y2 side (or a sun or second side) of the transmissive module 330.

Note that the module 340 includes a plurality of solar cells (e.g., the solar cell 341 can be optionally transmissive), which convert at least part of the unconverted portions of the light energy into electricity. The system 300 mechanically stacks of the at least two mechanically stacked modules to vertically align the plurality of solar cells of the module 340 with each of the plurality of transmissive solar cells of each of the optional module 310 and the transmissive module 330. In an embodiment, the mechanical stacking by the system 300 can further be sealed on one or more sides, such as by a screen, a water tight membrane, or an air filter as described herein. Example of mechanical stacking includes, but are not limited to, horizontal stacking, parallel stacking with a plane of a horizon (i.e., flat to the earth), and parallel stacking with a plane of an array (i.e., design determined). By maintaining cells/modules mechanically and electrically separated, the one or more modules 310, 330, and 340 can be designed to work together for electrical aggregation (e.g., which further enables a broader electrical component scope to achieve power aggregation).

In operation, the sunlight 102 passes through one or more modules 310, 330, and 340. The module 310 can absorb the light 102 at a first wavelength at a first spectral response. Light 391 (i.e., irradiance thereof) that is outside of the first wavelength and in residual excess of the first spectral response outside the first wavelength is further passed in the Y1 direction to the transmissive module 330.

The transmissive module 330 can absorb the light 391 at a second wavelength at a second spectral response. According to one or more embodiments, the first and second wavelengths can be the same. According to one or more embodiments, the first spectral response and the second spectral response can also be the same. Light 393 (i.e., irradiance thereof) that is outside of the second wavelengths and in residual excess of the second spectral response outside the second wavelength is further passed in the Y1 direction to the module 340.

Figure 4:
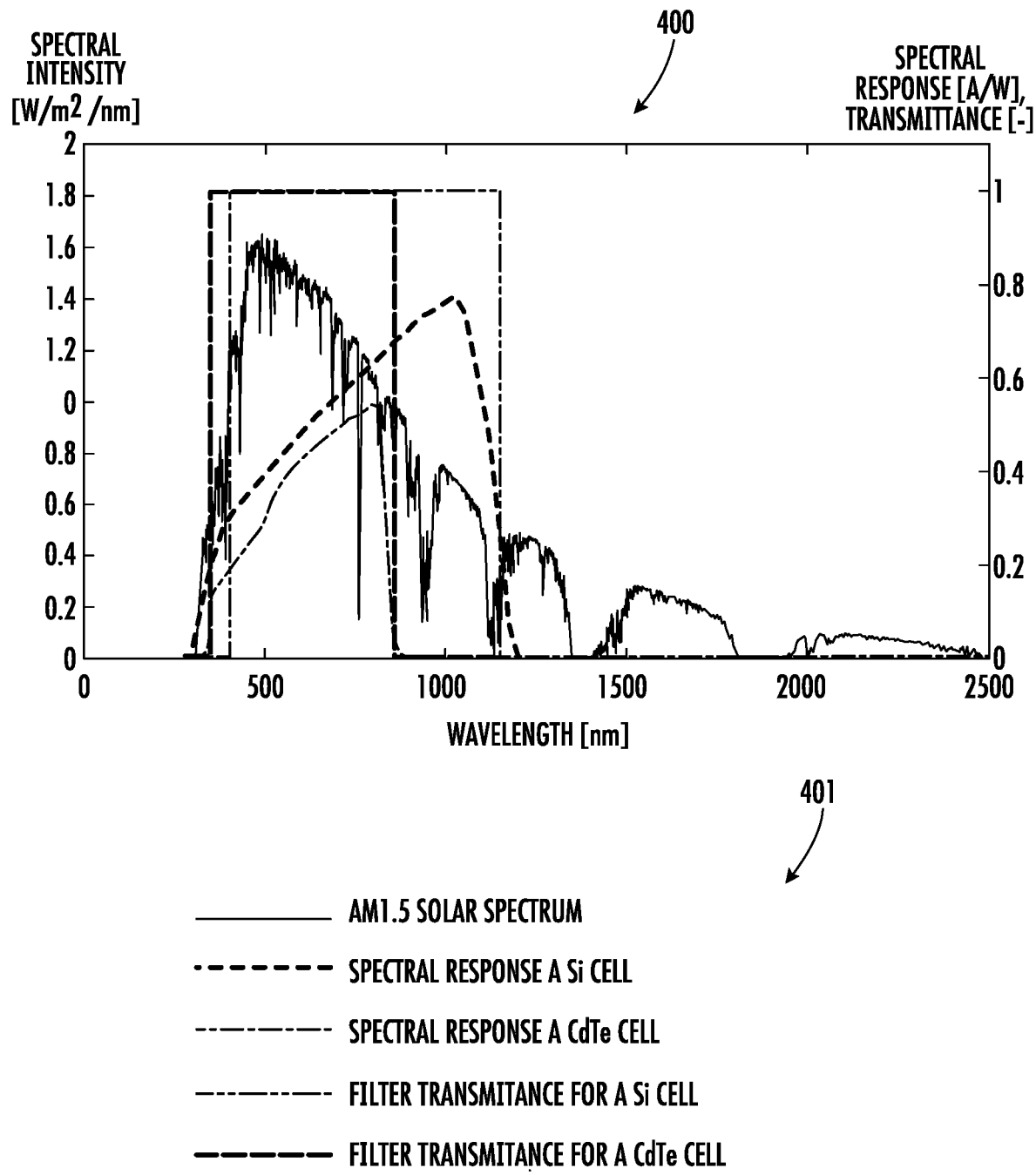
FIG. 4 depicts a graph according to one or more embodiments.

Turning to FIG. 4, a graph 400 is depicted according to one or more embodiments. The graph 400 is an example spectral response graph of CdTe (e.g., the transmissive solar cell 331 and the transmissive module 330) and c-Si (e.g., the solar cell 341 and the module 340). FIG. 4 also includes a key 401 identifying lines within the graph 400. The graph 400 includes an x-axis showing a nanometer scale for wavelength, as well as a left y-axis showing a spectral intensity and a right y-axis showing spectral response, transmittance. Note that the approximate absorption range for the CdTe is 400 to 800 nanometers (e.g., the second wavelength). For example, in the system 300, the transmissive module 330 absorbs irradiance of the light 391 in the 400 to 800 nanometer wavelength range and passes unabsorbed light energy in the wavelength range greater than 800 nanometers.

The module 340 can absorb the light 393 at a third wavelength at a third spectral response. According to one or more embodiments, the third wavelength can include and/or be wider than the second wavelength. Returning to FIG. 4, note that the approximate absorption range for the c-Si is 400 to 1200 nanometers (e.g., the second wavelength). The module 340 absorbs irradiance of the light 393 in at least the 800 to 1200 nanometer wavelength range and could pass light energy in the wavelength range greater than 1200 nanometers. The module 340 can also absorbs irradiance of the light 393 in the 400 to 1200 nanometer wavelength range, where the 400 to 800 nanometer wavelength range includes the light 393 (i.e., irradiance thereof) that is in residual excess of the second spectral response across the second wavelength. Further, light 395 (i.e., irradiance thereof) that is outside of the third wavelength and in residual excess of the third spectral response across the third wavelength is further passed in the Y1 direction to the reflective module 350.

The reflective module 350 reflects the light 395 in the Y2 direction back to the module 340. Any remaining irradiance of the light 395 can further be absorbed by the module 340 or passed as light 397 to the transmissive module 330 (e.g., the light 397 continues in the Y2 direction). Next, any remaining irradiance of the light 397 can further be absorbed by the transmissive module 330 or passed as light 399 to the module 310 (e.g., the light 399 continues in the Y2 direction). Note the fading of the arrows representing the light 102, 391, 393, 395, 397, and 399 illustrate the absorption of irradiance and descries of energy, as the light 102 is converted to electricity that is sent to the boxes 370. Note also that each a particular irradiance or portion thereof may not be absorbed on a first pass and may be absorbed on a second pass (i.e., in the Y2 direction).

Figure 5:
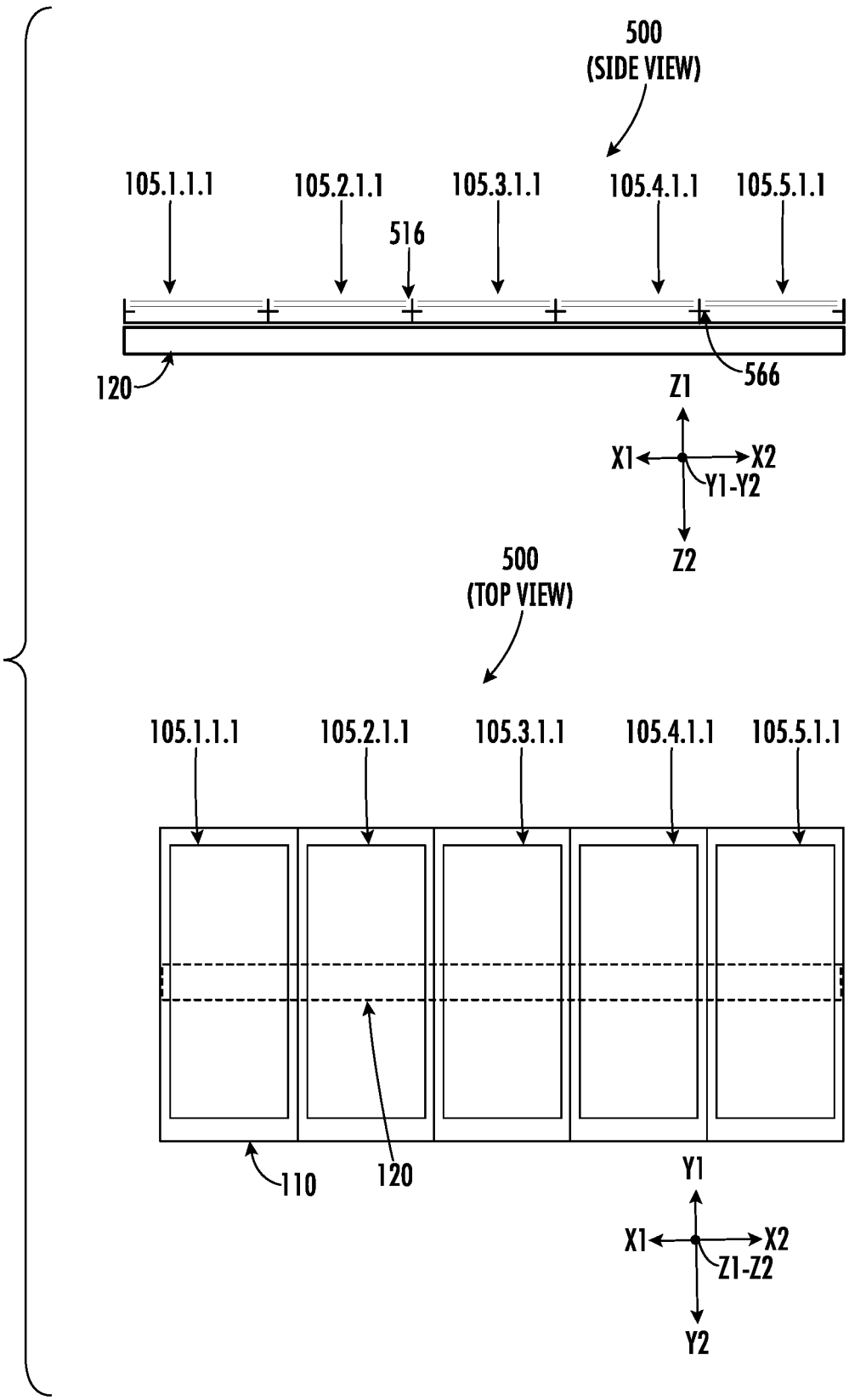
FIG. 5 depicts a configuration example of a system according to one or more embodiments.

Returning to FIG. 2, the system 200 can secure the mechanical stacking of the solar modules 105 by the arms 216. For instance, the arms 216 can be a structure that holds the solar modules 105 in a vertical stack (e.g., the Z direction) and/or other arrangement. For instance, turning to FIG. 5, a system 500 is depicted that includes arms 516 according to one or more embodiments. The system 500 represents a configuration example of the system 200 of FIG. 1. The system 500 includes a y by x by z configuration of 5 by 1 by 1. For example, the system 500 can be referred to as at least a 5 by 1 configuration or a 5 by 1 by 1 configuration. Each solar module 105 can be further designated by an y by x by z coordinate, where x, y, and z are integers greater than 0. For example, a solar panel 105.1.1.1 is a first column, first row, and first vertical position and a solar panel 105.4.1.1 is a fourth column, first row, and first vertical position. Note that, conventionally, a solar panel generally goes on top of a support and is permanently fixed in place. In contrast, the system 500 enables receiving the solar modules 105 into the frame 110 supported by the beam arrangement 120, Further, the arms 516 of the system 500 are configured to reduce shading. According to one or more embodiments, the arms 560 can be sized along a range of one to ten centimeters tall or in a Z1 direction and include a support member 566 (e.g., that is located three quarters of the way from a Z2 end of the arm 516).

Figure 6:
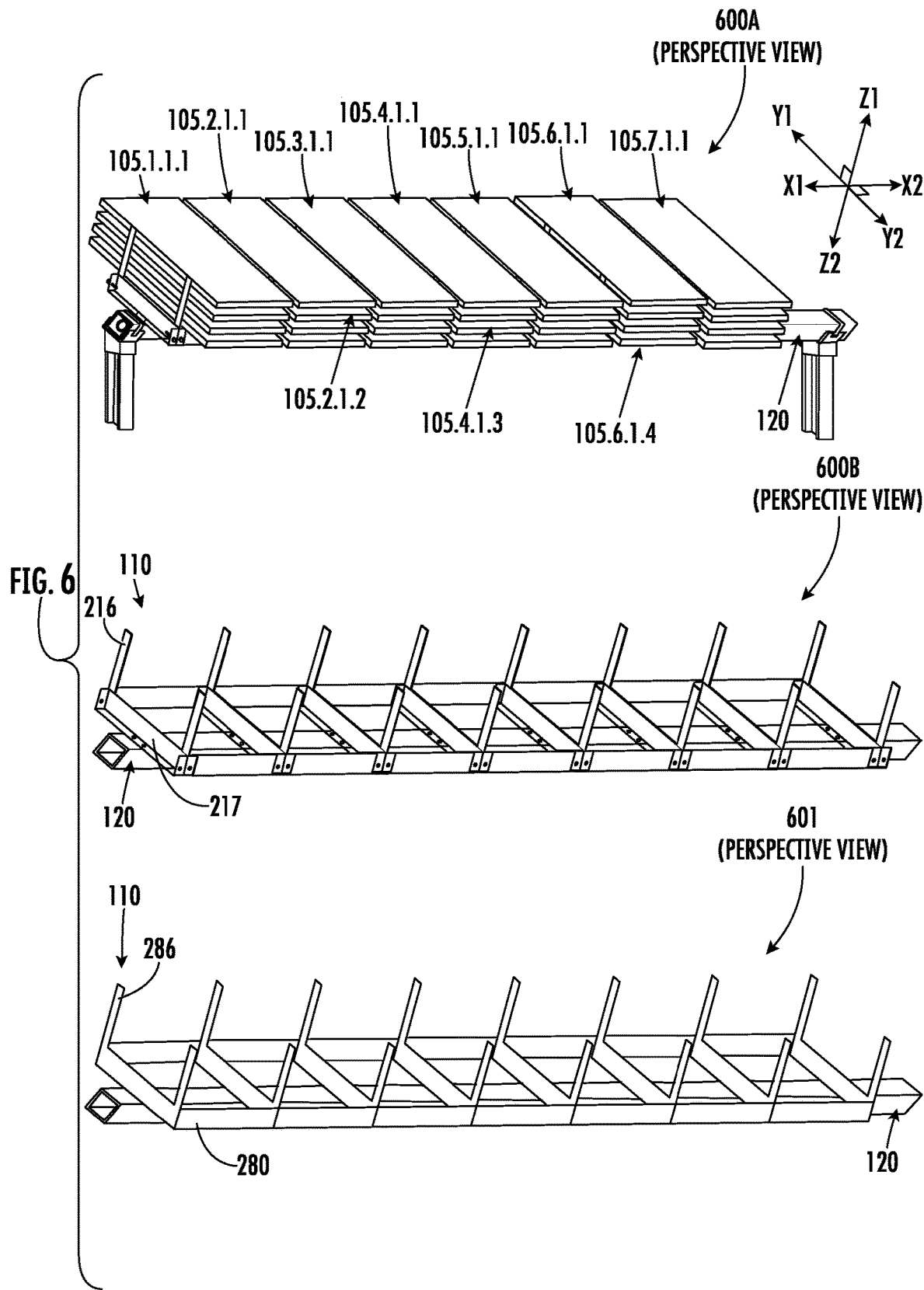
FIG. 6 depicts examples of a system according to one or more embodiments.

FIG. 6 depicts examples of a system 600 according to one or more embodiments. Note that, by way of example in conjunction with the other drawings, like reference numerals in the figures indicate like elements and will not be reintroduced for brevity. The system 600 is shown from a perspective view with (600A) and without (600B) the solar modules 105. The system 600 includes several instances of the frame 110, on the beam arrangement 120, each frame 110 including one or more arms 216 and one or more holders 217. The frames 110 can be a y by x configuration, which further enable the modules to be arranged in a y by x by z configuration, where x, y, and z are integers greater than 0. Note that instance of each frame 110 the can be considered a cartridge holders and can be shipped separately and assembled on-site with the solar modules 105. For instance, as shown in the system 600A, the frames 500 can be referred to as at least a 7 by 1 configuration, while the modules are in a 7 by 1 by 4 configuration. Each solar module 105 can be further designated by an y by x by z coordinate. For example, a solar panel 105.7.1.1 is a seventh column, first row, and first vertical position and a solar panel 105.4.1.3 is a fourth column, first row, and third vertical position. Additionally, an alternative illustration of the system 600 is depicted as system 601 (also without any modules 105 therein). Further, as shown in system 601, each frame 110 can also be a continuous structure that includes a base portion 280 and arm portions 286.

Figure 7:
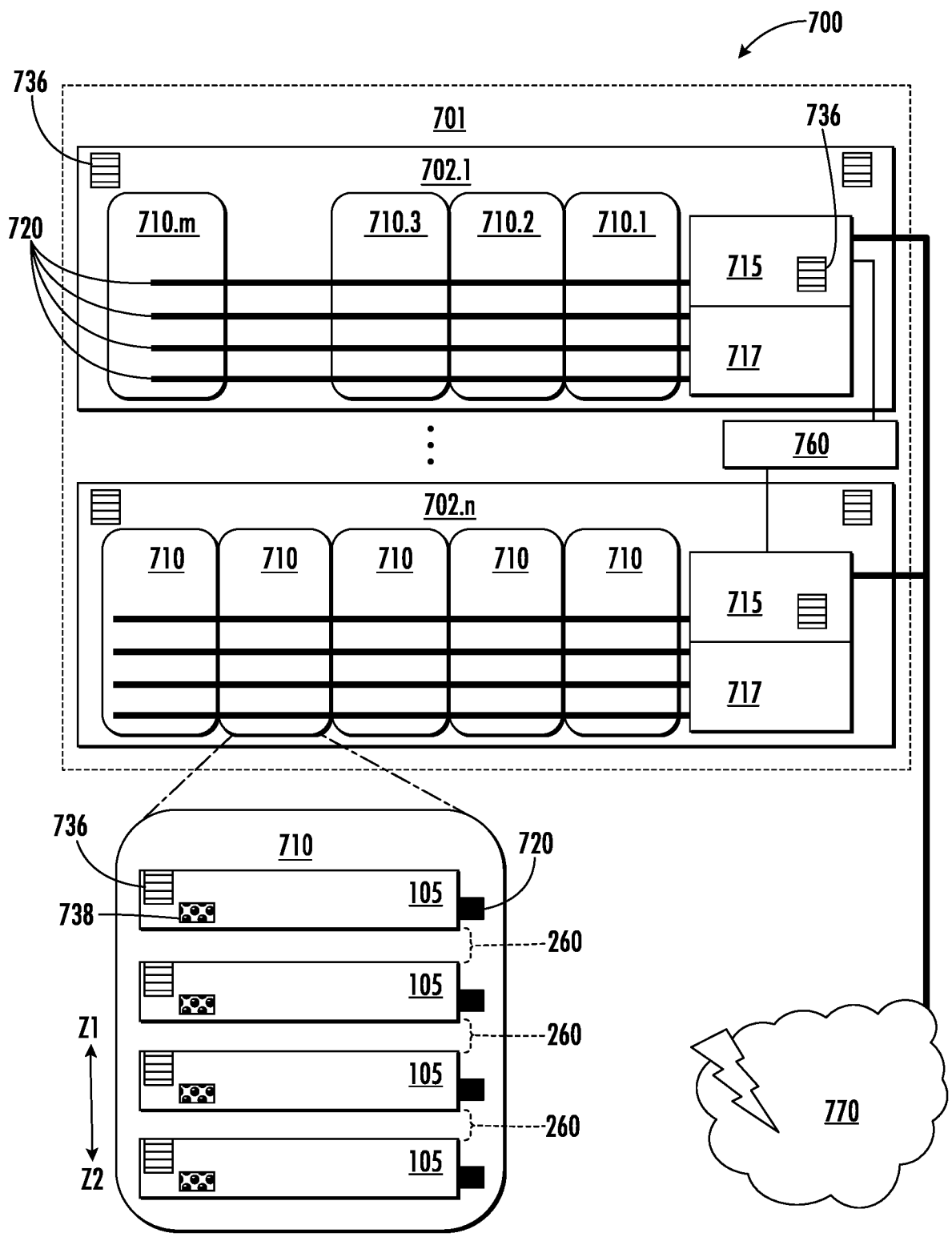
FIG. 7 depicts an environment according to one or more embodiments.

Turning now to FIG. 7, an environment 700 is illustrated according to one or more embodiments. The environment 700 can include one or more modular solar systems (i.e., solar module racking system for solar power generation) as discussed herein. Embodiments of the environment 700 include apparatuses, systems, methods, and/or computer program products at any possible technical detail level of integration. Note that, by way of example in conjunction with the other drawings, like reference numerals in the figures indicate like elements and will not be reintroduced for brevity.

According to one or more embodiments, the environment 700 can be representative of the modular solar system located within a field 701 and including one or more systems 702.*n* (where n is an integer). More particularly, the environment 700 can include systems 701 (which can represent any of the systems described herein) that support one or more mechanically stacked solar transmissive modules (i.e., the solar modules 105) within one or more frames 710 (which can represent any of the frames described herein) to receive and convert light energy (e.g., from at least the sun 101, though other sources are contemplated). In this way, embodiments of the environment 700 include apparatuses, systems, methods, and/or computer program products at any possible technical detail level of integration.

The field 701 can be any terrain or expanse of open or cleared ground for supporting the one or more systems 702.*n*, as well as rooftops and/or other property areas. For example, any single component of the system 702 can be placed within the field 701, such as a being placed directly on a roof without the post 130, the cap 140, and/or the beam arrangement 120. Each system 702 includes at least an inverter 715, a switch 717, a string 720, and the one or more frames 710 (where m is an integer). Each frame 710 (e.g., the frame 110) can include the one or more modules 105 (e.g., the modules 310, 330, and 340 to the bus 380).

The inverter 715 can be any power electronic device or circuitry that changes between currents, such as direct current (DC) to alternating current (AC). The switch 717 can be a de-energizing switch that grounds each system 702. According to one or more embodiments, the switch 717 provides electrical latching, when the systems 702 is energized, and prevents ejection. The string 720 can be any electronic configuration that connects one or more electrical components (e.g., the one or more modules 105), whether in series or in parallel to a particular electrical component (e.g., such as the inverter 715). The string 720 can include a plurality of pre-wired receptacles for rapid assembly of the one or more modules 105 into the frames 710.

Each module 732 is connected to a corresponding string 720 (e.g., via a pre-wired receptacle, a pin connection, a pig tail connection, or the like) and has an interim section 634 (e.g., the interim section 120 of FIG. 1 or distance 250 of FIG. 2) defining a distance from other modules 732. Each module 732 can also include at least one sensor 736 and a code 738. Further, additional sensors 736 can be located through the systems 702 and the environment 700. The environment 700 and elements therein (e.g., any of the sensors 736) can be managed a device 760. Further, the environment 700 can be connected to a grid 770 and can be managed by a maintenance robot, a drone, a technician, or the like.

According to one or more embodiments, the system 702 and the frames 710 can be assembled in a factory setting, including pre-wiring to reduce field assembly costs in the field 701 while increasing quality. When the frames 710 are shipped to the field 701, the frames 710 can be connected together and then erected like a puzzle with respect to the systems 701. The one or more frames 710 can have dimensions to accommodate modules 105 (e.g., 1×2 meters in length and width) and to provide spacing that accommodates cooling and bandgap distribution. According to one or more embodiments, 1 inch high modules with 1 inch spacing therebetween provides an 8 inch high module (e.g., that may look like a pancake stack). In turn, the system 702 can provide lateral stability side to side, while the solar module 105 provides stability front to back stability. According to one or more embodiments, the solar modules 105 can be adjacent (e.g., may be stacked directly on top of each other without spacing therebetween).

According to one or more embodiments, the environment 700 includes the systems 702, the frames 710, and the at least two mechanically modules 105 in the field 701 with sensors 736. The environment 700 illustrates, on a macro level, how elements and things are connected within a greater network for alerts, as well as to provide electricity the grid 770 or other load (e.g., one or more batteries). The frame 710 can be any integrated system that provides three dimensional solar system applications. The at least two mechanically modules 105 include a bottom module and one or more upper modules as described herein.

Figure 8:
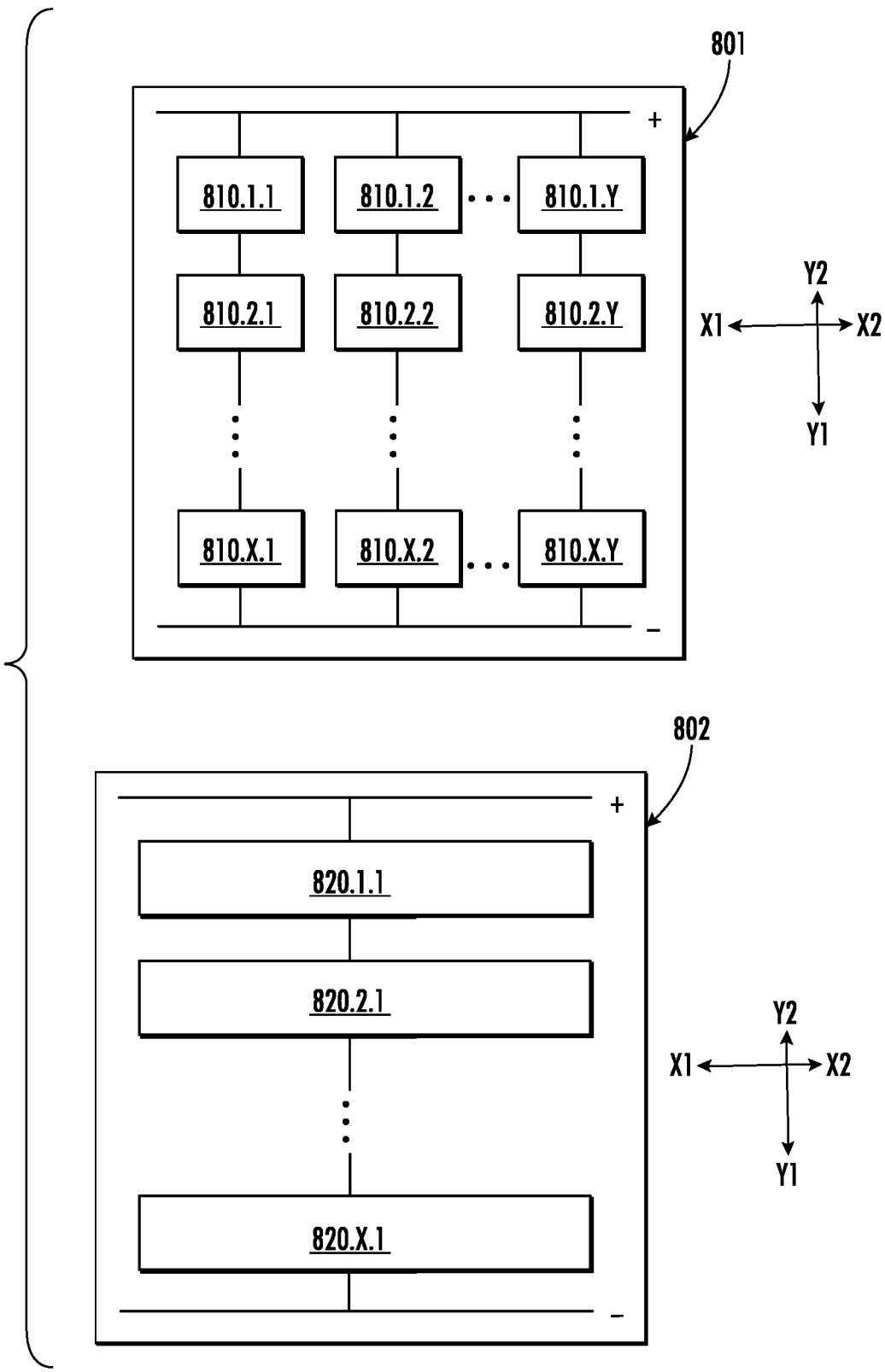
FIG. 8 depicts modules according to one or more embodiments.

The systems 702 securing a mechanical stacking of the at least two mechanically stacked solar modules 105 to vertically align the plurality of solar cells and/or transmissive solar cells of the at least two mechanically modules 105. Each of the solar modules 105 of the environment 700 can further include one or more solar cell arrangements. For instance, turning now to FIG. 8, modules 801 and 802 are depicted according to one or more embodiments. The modules 801 and 802 can also be an example configuration of any of the solar modules 105 and the modules 330 and 340 discussed herein. The module 801 includes one or more cells 810 arranged in an x-y grid, where both x and y are integers greater than 0. The module 802 includes one or more cells 820 arranged in an x-y grid, where x is 1 and y is an integer greater than 0. The width, wiring, configuration of cells 810 and 820 can be managed and operated to control power generation on a per cell basis.

According to one or more technical effects, advantages, and benefits, the frame 710 enable the solar modules 105 to be easily moved, replaced, and/or exchanged, such as for future generation modules 105. The frame 710 stacks the solar modules 105 vertically to maximize a solar energy captured per square meter of surface area. Further, a vertical aspect of ordering the solar modules 105 within the frame 710 enables capturing each bandgap, cooling, spacing, etc. According to one or more embodiments, the frame 710 can utilize a shell or casing that holds multiple solar modules placed on top of another, with the space 634 therebetween allowing for airflow for cooling or without a space. According to one or more embodiments, a top solar module can be a concentrator or micro-concentrator, one or more middle modules can be one or more transmissive modules, and a bottom module can capture any remaining light energy (e.g., infrared radiation) or be reflective. Note that, in an example, the frame 710 stacks four layers of modules 105, where each module 732 corresponds to one of the strings 720. Each string 720 corresponds and electrically connects to one of the at least two mechanically staked modules 105 to receive the electricity therefrom. Each string 720 is electrically distinct from other strings 720.

According to one or more embodiments, the environment 700 can also include a uniform design, where the solar modules 105 are connected in series or parallel. For example, each cell of a module 732 can provide 1.5 volts. Further, 32 cells can be connected in series within each module 732 that are further connected in series per string 720 (e.g., 18 modules 105 in series per string 720 provides 864 volts). The inverters 715 can combine 32 strings 720 in parallel to produce a high current that is provided to the grid 770. According to one or more embodiments, the environment 700 can also include a tiered design, where the solar modules 105 of the one or more strings 720 are connected in parallel, the solar modules 105 of the one or more strings 720 are connected in series, and/or a combination thereof (e.g., a collection of tiers managed in a hybrid environment).

The system 702 can be a pre-wired modular racking system that incorporates one or more technology aspects (e.g. modular DC optimizers) described herein. According to one or more embodiments, the system 702 can be an aggregation of the one or more frames 710 thereof. A structure of the system 702 can be made of carbon fiber, steel, metal, alloy, wood, plastic, fiberglass, or any combination thereof. According to one or more embodiments, the system 702 can be a "smart rack" system given the sensors 736 and an ability to be communicatively coupled to the device 760.

According to one or more technical effects, advantages, and benefits, the frame 710 enables single p-n junction cells (which are cost effective compared to other technologies) to be layered in a stacking structure, which is distinguished from tandem cells by not bonding the solar modules 105 and keeping the electricity distinct. Further, according to one or more technical effects, advantages, and benefit, the frame 710 provides improved modularization that facilitates easy field installation to reduce a balance of plant (BOP) cost structure. For example, solar module prices currently correspond to approximately $0.40 per watt for a utility-scale solar power project cost in the United States of America and include diminishing returns in solar cell cost reductions. Also, BOP cost reductions have made very little progress with conventional solar technologies and have not dropped proportionally as conventional solar technologies advance. Different government agencies target the overall cost threshold for a solar power plant at $0.50 per watt (DC) to be cost-competitive with traditional fossil fuels. This goal is only achievable if there are significant improvements with BOP costs. A way to accomplish this goal is by increasing sunlight capture density per land surface area, thereby decreasing electrical production costs by spreading BOP costs over higher kWh of power production. Further, according to one or more technical effects, advantages, and benefit, the frame 710 is more feasible for homes and commercial buildings where rooftops and property areas are limited. In turn, the frame 710 can make buildings Net Zero electricity consumers and virtually taken off the grid 770. Further, according to one or more technical effects, advantages, and benefit, the environment 700 can salvage infrastructure while having the flexibility to harness future technological improvements (e.g., a solar lifespan averages at 15 years; while in contrast the environment 700 can now extend that lifespan to greater than 50 years).

Figure 9:
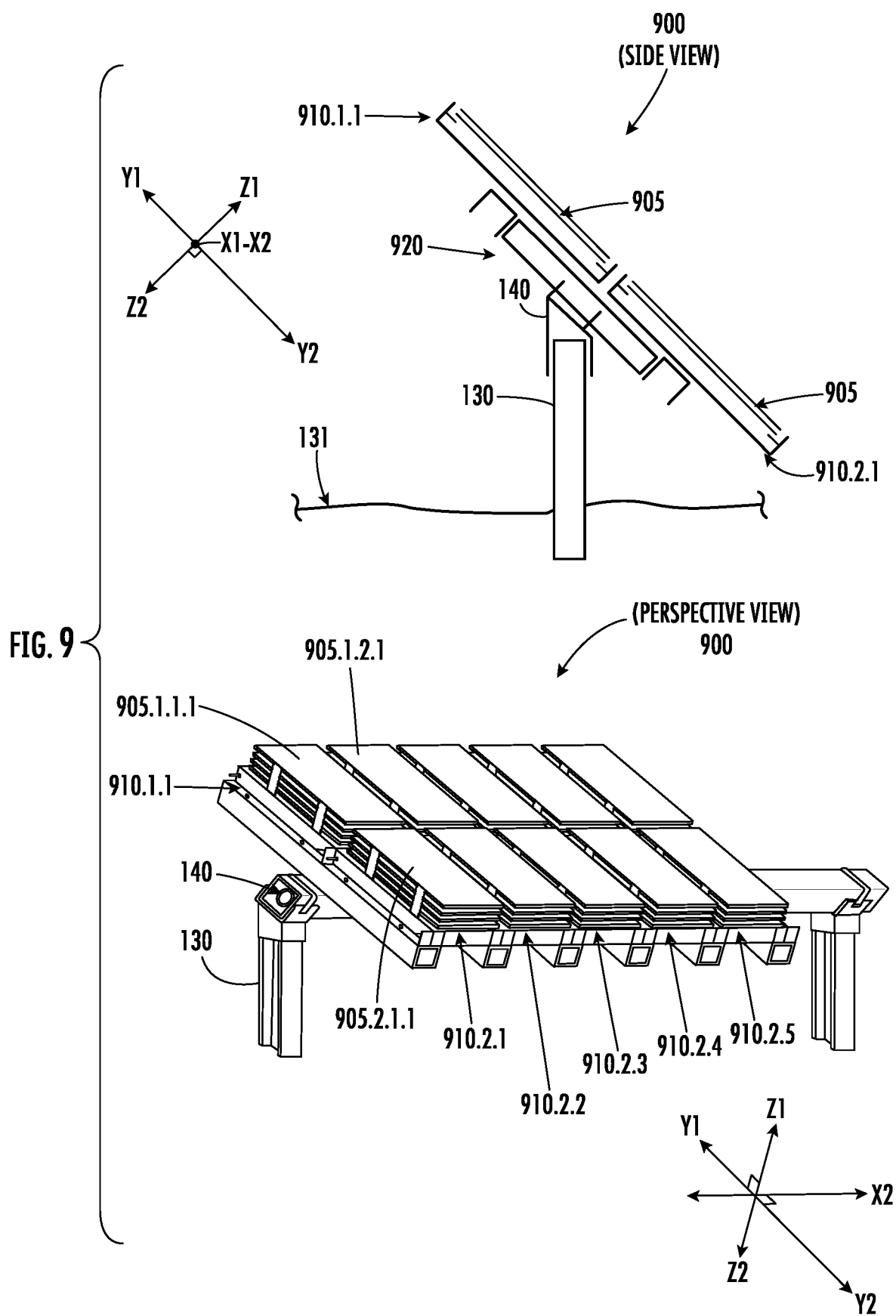
FIG. 9 depicts a system according to one or more embodiments.

FIG. 9 depicts a system 900 according to one or more embodiments. The system 900 is an example of the solar module racking system as described herein and is shown from a side view and a perspective view. Note that, by way of example in conjunction with the other drawings, like reference numerals in the figures indicate like elements and will not be reintroduced for brevity. The diagram of FIG. 9 is oriented according to an X1-X2 axis, a Y1-Y2 axis, and Z1-X2 axis. The X1-X2 axis, as represented as a dot/circle, axis is generally oriented into and out of the page or normal to a Y-Z plane. The Y1-Y2 axis is generally oriented in a direction normal to an X-Z plane. The Z1-Z2 axis is generally oriented in a direction normal to an X-Y plane. The X1 direction is opposite the X2 direction, the Y1 direction is opposite the Y2 direction, and the Z1 direction is opposite the Z2 direction. Other orientations can be made in accordance with these axes, which may be tilted or angled. References to a side or a surface of a component can be described in accordance with these axes. For instance, a reference to a lower or bottom side or a downwardly facing surface of a component described may be referred to as a Z2 side or a Z2 surface.

The system 900 receives, from at least the sun 101 (from the Y1-Z1 direction), the light 102 at a plurality of solar modules 905. The system 900 includes a post 130 mounted to a surface (i.e., a ground 131), and a cap 140. The system 900 includes a frame, a framework, or a stacking structure, e.g., shown as a plurality of frames 910.x.y (shown as the frame 910.1.1, the frame 910.2.1, etc.) and a beam arrangement 920.

The plurality of frames 910 can receive and mechanically support each module of the plurality of solar modules 905. The frame 910 arranges the plurality of solar modules in a first planar direction (the X or Y direction of the X-Y plane), in a second planar direction (a remaining X or Y direction of the X-Y plane), and in a vertical direction (the Z direction) that is normal to the first and second planar directions.

Each of plurality of pre-wired receptacles. The solar module racking system provides at least a 1 by 1 by 2 configuration for the plurality of solar modules corresponding to the first planar direction, the second planar direction, and the vertical direction where at least a first module and a second module are arranged and mechanically stacked in the vertical direction.

Each frame 910.x.y can include a plurality of pre-wired receptacles for rapid assembly of the plurality of solar modules 905 (i.e., individually and electrically connect after insertion of that module 905 into the frame 910). Each receptacle can correspond to a position along the vertical or Z direction.

Figure 10:
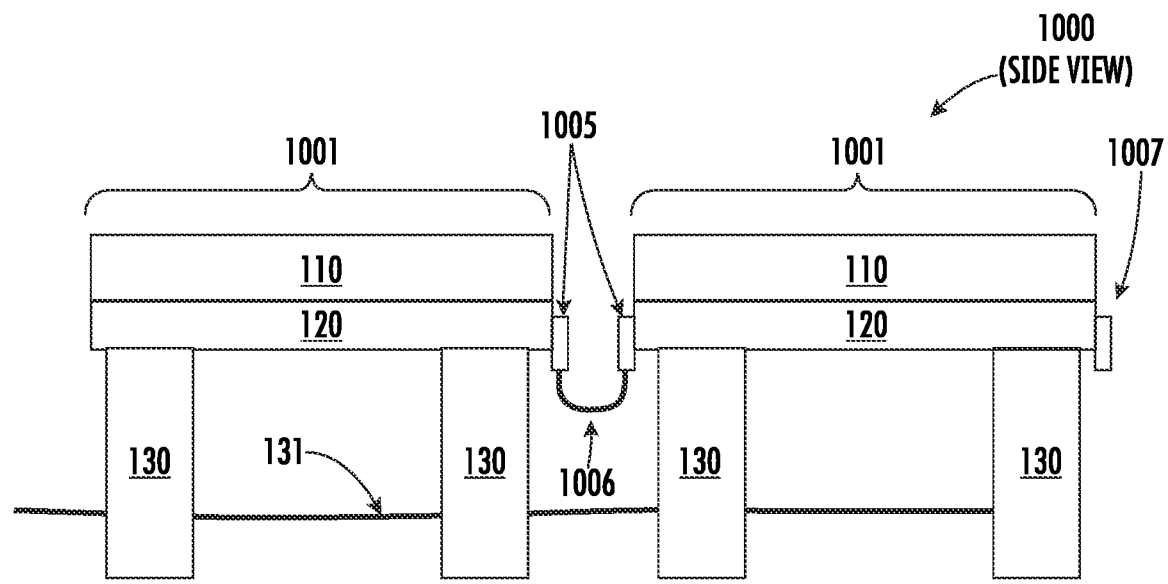
FIG. 10 depicts a configuration example of a system according to one or more embodiments.

FIG. 10 depicts a configuration example 1000 of one or more systems that are connected according to one or more embodiments. The configuration example 1000 illustrates two systems 1001 and 1002, each including a junction box or electric outlet 1005 (e.g., the PV bus connector and the PV connector box) connected by wiring or electrical cable 1006. The wiring or electrical cable 1006, more particularly, connects the two systems 1001 and 1002 by varying in length to accommodate different angles and mounting heights. Note that wiring channels are in the beam arrangement 120 of the two systems 1001 and 1002. An electrical combiner box 1007 corresponds to strings of the two systems 1001 and 1002 that provide electricity.

Figure 11A:
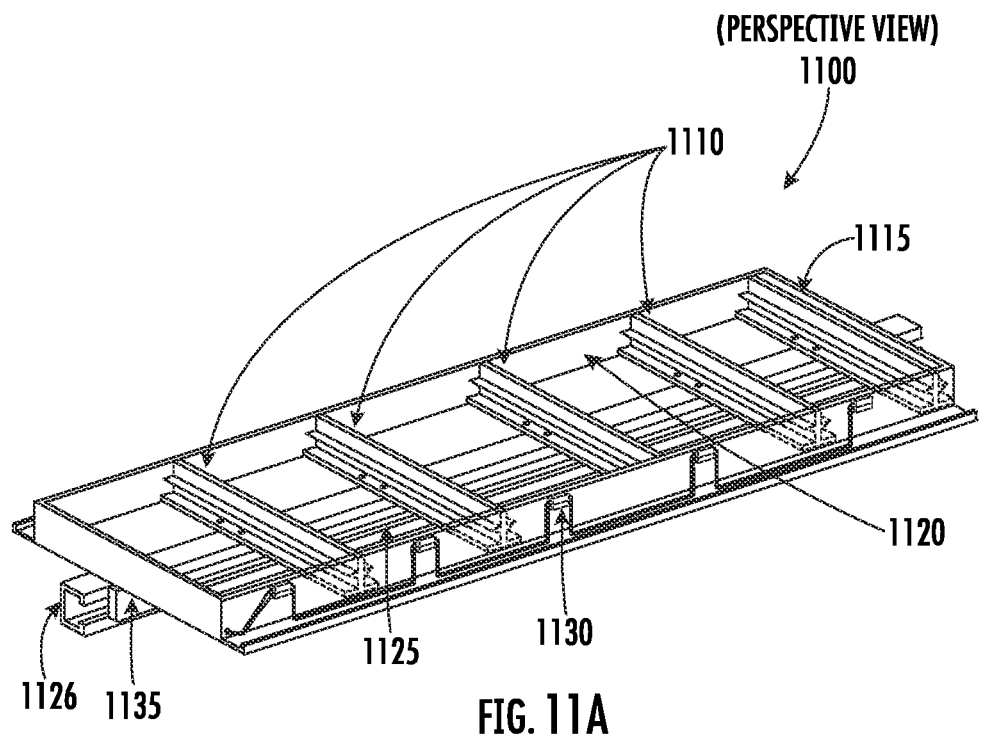
FIGS. 11A-11D depict details views of a wiring of a solar module racking system for solar power generation according to one or more embodiments.

FIGS. 11A-11D depict details views of the wiring of the solar module racking system for solar power generation according to one or more embodiments. As shown in FIG. 11A, a frame 1100 is system that can be built in a factory (i.e., robotically or not) and can act as a structural assembly for custom modules. The frame 1100 includes T-frame members 1110 and L-frame members 1115, as well as flat stock 1120. A top surface/area and/or a bottom surface/area of the frame 1110 can remain open. The beam arrangement 1125 supports the frame 1110. The beam arrangement 1125 can be a C-channel support as shown as an end 1126. The flat stock 1120 can support one or more electrical snap-in power sensors 1130, each corresponding to a module location where the frame 1110 can receive a module. The one or more electrical snap-in power sensors 1130 can be connected via one or more wires/strings to the combiner box 1135.

Figure 11B:
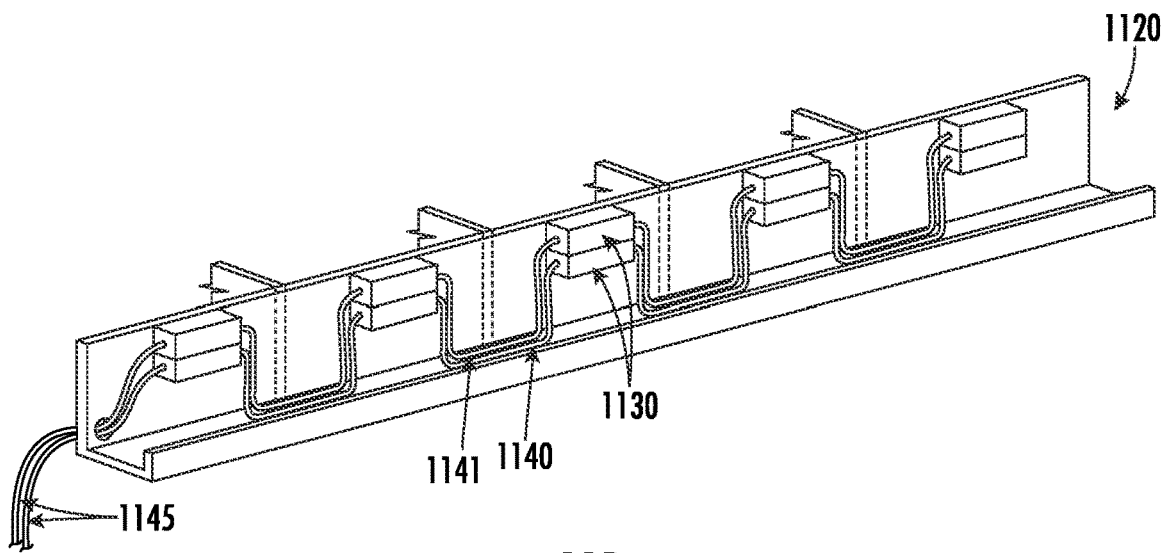

As shown in a zoomed in perspective view of FIG. 11B, a flat stock 1120b includes double modules assemblies for the electrical snap-in power sensors 1130. The wiring 1140 and 1141 connect each tier of assemblies (form a string for modules on a same level) and terminate pig tail connections 1145.

Figure 11C:
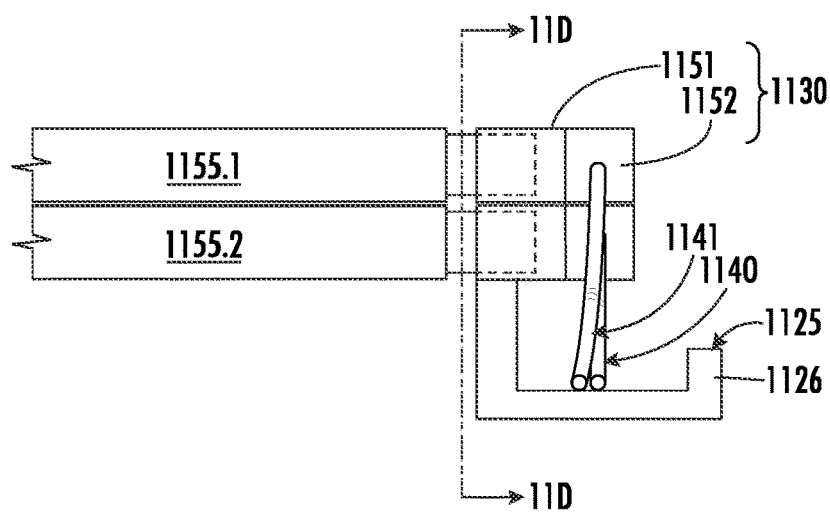

As shown in a zoomed in side view of FIG. 11C, the flat stock 1120b includes double modules assemblies for the electrical snap-in power sensors 1130. Each electrical snap-in power sensor 1130 includes a snap-in plug 1151 and a power sensor 1152. The snap-in plug 1151 receives one of the modules 1155.1 and 1155.2.

Figure 11D:
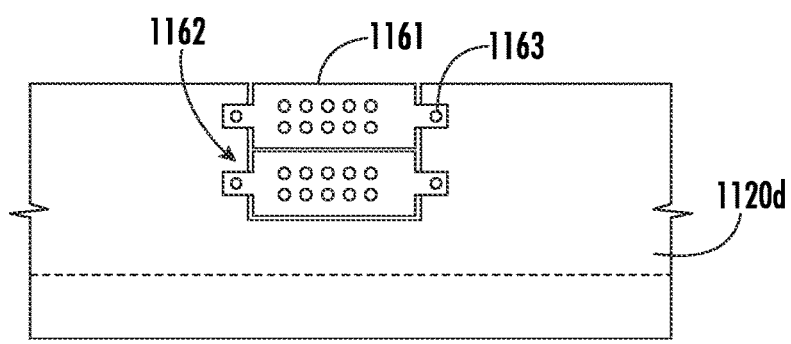

As shown in a zoomed in internal view of FIG. 11D, the electrical snap-in power sensors 1130 of the flat stock 1120d include plugs 1161 and 1161 (e.g., the connector 1685 of FIG. 16), each with corresponding fasteners 1163.

Figure 12:
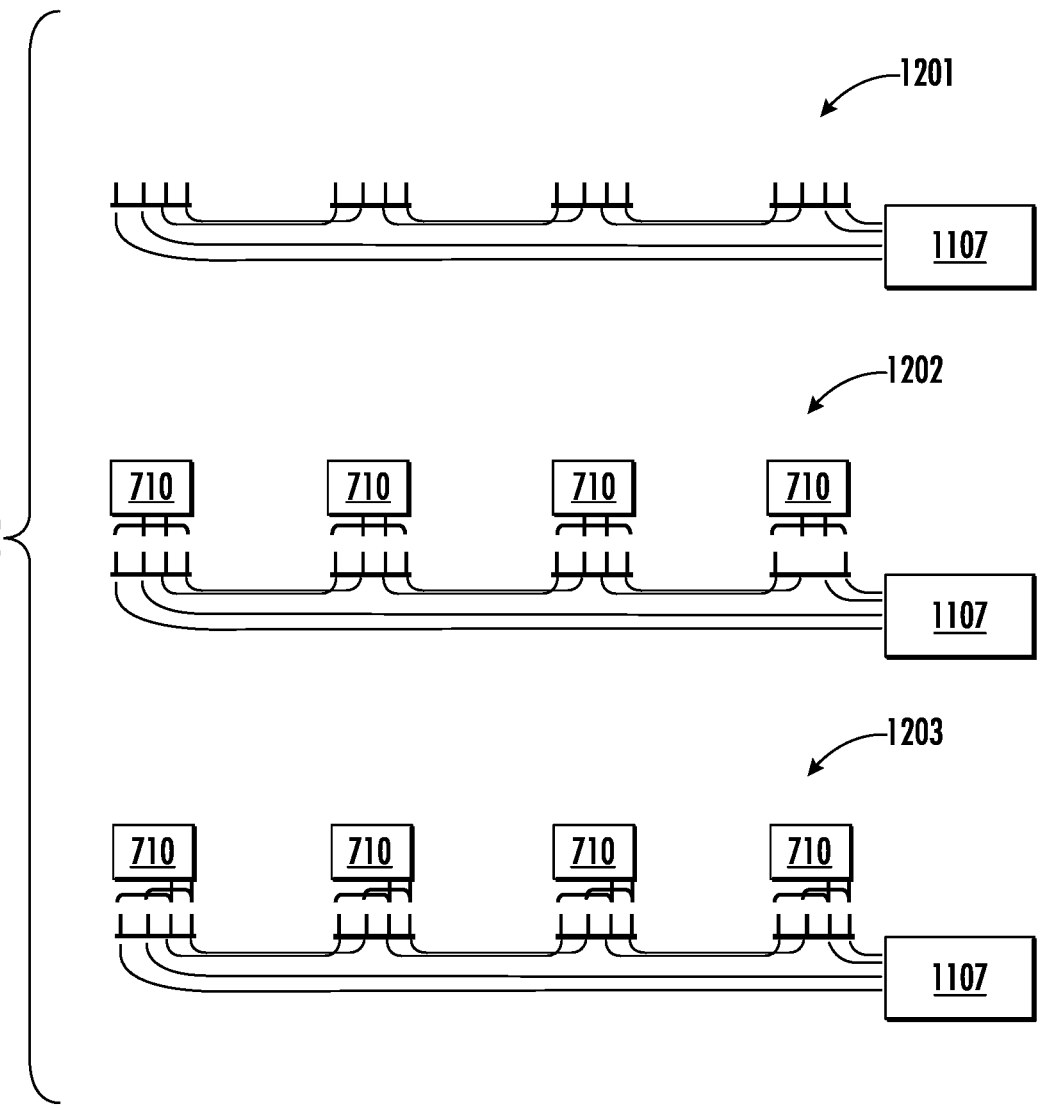
FIG. 12 depicts wiring diagrams a solar module racking system for solar power generation according to one or more embodiments.

FIG. 12 depicts prefabricated wiring examples 1201, 1202, and 1203 according to one or more embodiments. The wiring diagram 1201 illustrates a frame and module wiring (e.g., the string 720 of FIG. 7) that enables each module on a tier to be wired in serial or parallel. The wiring diagram 1202 illustrates a serial wiring, while the wiring diagram 1203 illustrates a parallel wiring. As shown, the wiring diagram 1201 includes a 4 pin connector (e.g., the connector 1685 of FIG. 16) for each module as a base frame wiring. According to one or more embodiments, by using a 4 pin connector, any appropriate serial/parallel wiring can be put in the module itself, effectively reconfiguring from a parallel to serial wiring (or vice versa). For example, if one tier is perovskite, then each module for that that tier can be configured to be wired in parallel. Further, if another tier is crystalline silicon (c-Si), then that tier can be configured in serial. In turn, the appropriate wiring configuration can be completed in the modules of those tier at the time of manufacture, ensuring each tier is always correctly wired. Additionally, based on the wiring, mixed modules (e.g. one serial, one parallel), alternating them in certain positions, can be provided (e.g., thereby allowing for a hybrid parallel/serial aggregation within a configuration). Also, a switch on the modules can enable on-sight re-configuration from parallel to serial (or vice versa) and/or using two different wiring configurations of the same module. According to one or more embodiments, a hybrid configuration can be provided where strings includes modules wired in parallel while the strings themselves are wired in series. This hybrid configuration can result in 1,1600 volts with a moderate current.

Figure 13:
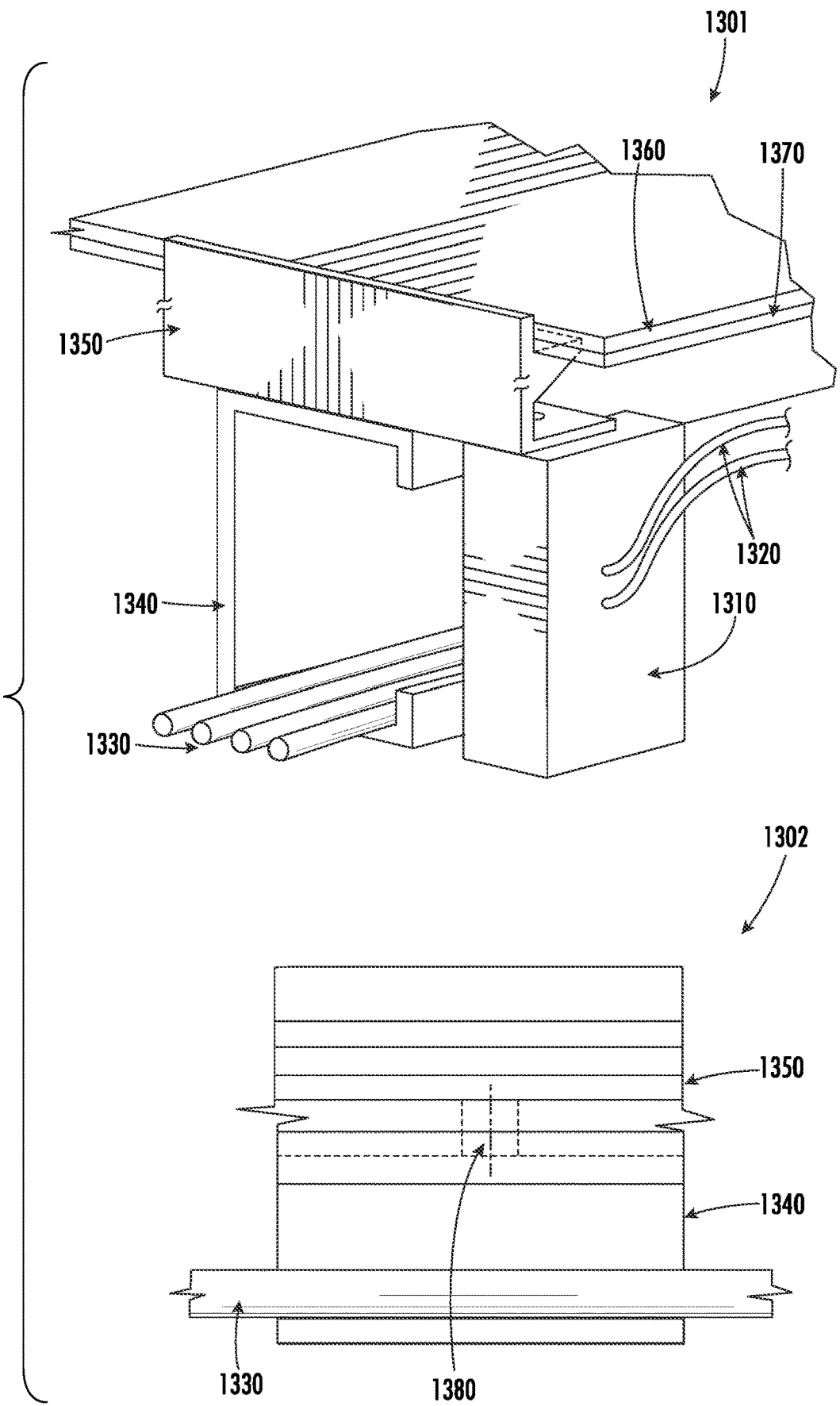
FIG. 13 depicts views of a solar module racking system for solar power generation according to one or more embodiments.

FIG. 13 depicts perspective view 1301 and a side view 1302 of the solar module racking system for solar power generation according to one or more embodiments. As shown in FIG. 13, the solar module racking system includes a combiner box 1310, wires 1320, conductors 1330, C-channel support 1340, a frame 1350, modules 1360 and 1370, and connection hole 1380 (to receive a fastener, such as a bolt or snap-in connection). Note that the wires 1320 can correspond to the modules 1360 and 1370 such that a string of the solar module racking system terminates in the combiner box 1310. The C-channel support 1340 can provide a cable tray, as well as torsional rigidity.

Figure 14:
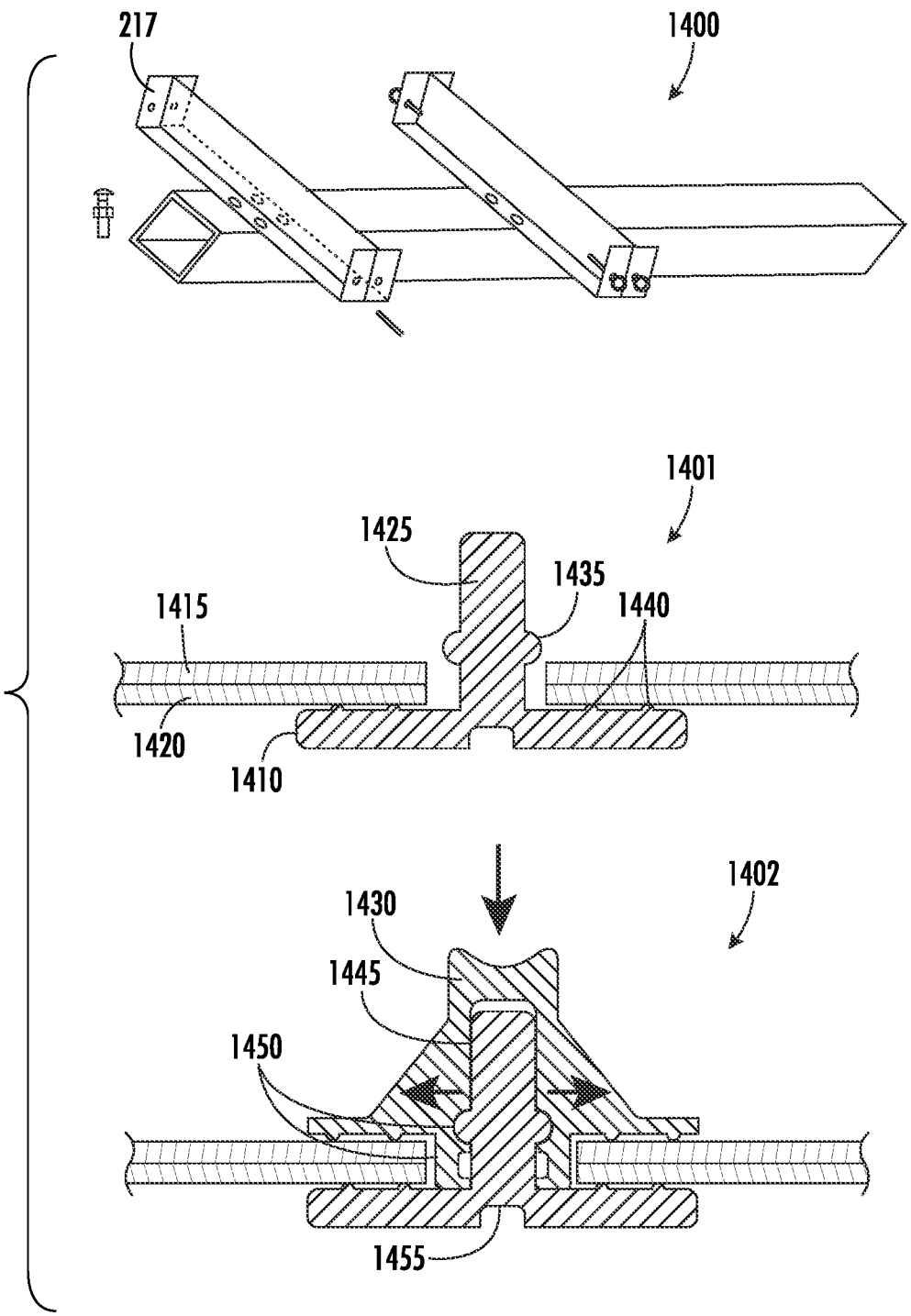
FIG. 14 depicts views of a solar module racking system for solar power generation according to one or more embodiments

FIG. 14 depicts views 1400, 1401, and 1402 of the solar module racking system for solar power generation according to one or more embodiments. The view 1400 of the solar module racking system includes the beam 224 supporting one or more holders 217. An example of the one or more holders 217 can be find in a cross-sectional view 1401 and 1402. In the cross-sectional view 1401, a bottom extrusion 1410 with two module assemblies 1415 and 1420 placed on either side of a flange 1425. The flange 1425 is configured to receive a top extrusion 1430 of the cross-sectional view 1402. The bottom extrusion 1410 and the top extrusion 1430 are configured to clamp in place. For instance, a rail 1435 running a lateral direction of the flange 1425 can set a height of the top extrusion 1430. In this regard, the two module assemblies 1415 and 1420 rest on pads 1440 of the bottom extrusion 1410, while a slot 1445 at slides over and clamps (e.g., snaps-on) the flange 1425. The slot 1445 can have one or more groves 1450, each of which can set a height of the top extrusion 1430 to accommodate one or more modules. The bottom extrusion 1410 and the top extrusion 1430 can be removed in the field 701. The grove 1455 can provide torsional rigidity.

Figure 15:
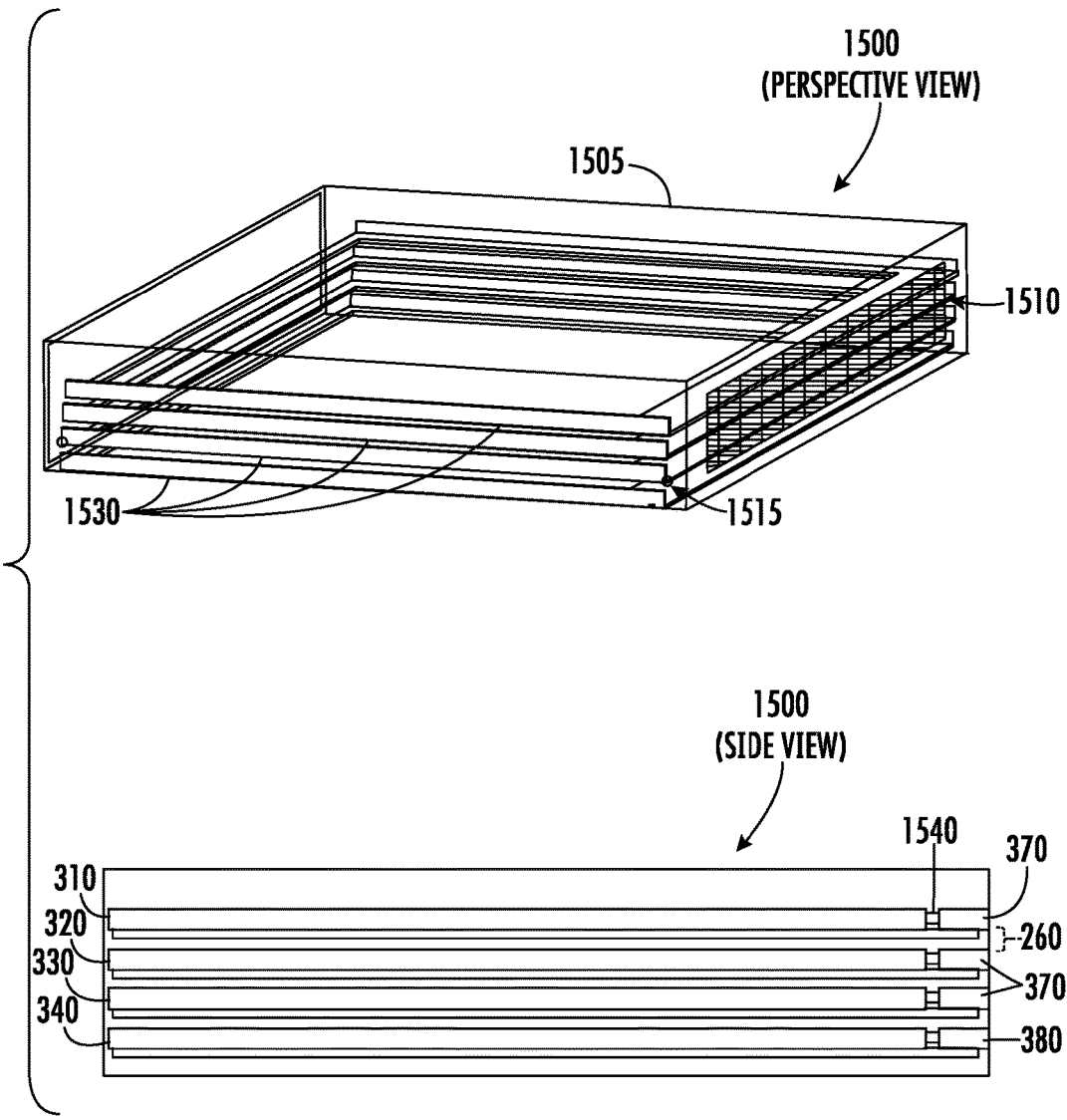
FIG. 15 depicts a frame according to one or more embodiments.

By way of example, FIG. 15 depicts a frame 1500 according to one or more embodiments. The frame 1500 is shown from a perspective view and a side view through side walls thereof. The frame 1500 includes a shell 1505, a vent grate or opening 1510, a hole 1515 (e.g., to accept a fastener to attach to the frame 1500 to a frame), and one or more shelves 1530.

The one or more shelves 1530 can be support the modules 310, 330, 340, and 350 and the boxes 370 and 380 to hold these components in a vertical stack, with interim sections 260 therebetween allowing for seal, airflow, cooling, etc. The one or more shelves 1530 can be brackets, L-shaped flanges, or the like that provide a plurality of levels within the frame 1500, such as a top level, a top-middle level, a bottom-middle level, and a bottom level. Note that the shelves 1530 enable the interim section 260 between the modules 330 and 340. Further, note that each of the modules 330 and 340 includes a connector 1540 (e.g., via a pre-wired receptacle, a pin connection, a pig tail connection, or the like) that electrically couples that module 330 and 340 with a corresponding box 370. The connector 1540 can include designs that eliminate a need for nuts and bolts, further making field servicing easy.

According to one or more embodiments, the frame 1500 secures a mechanical stacking of the modules 330 and 340 (e.g., thereby providing an alternative design to tandem cells by way of a mechanically stacked configuration that is not bonded). According to one or more embodiments, the frame 1500 is a frame and rail system where the one or more shelves 1530 act as horizontal slider tracks that the modules 330 and 340 lay upon. Note that the frame 1500 can include an open top (e.g., so the light 102 can cast onto any modules 330 and 340 therein) and an open bottom, as well as vent grate or opening 1510 or open walls to allow to direct airflow. The frame 1500 or any parts thereof can be made of metal, wood, plastic, fiber glass, carbon fiber or other structural materials as described herein.

Figure 16:
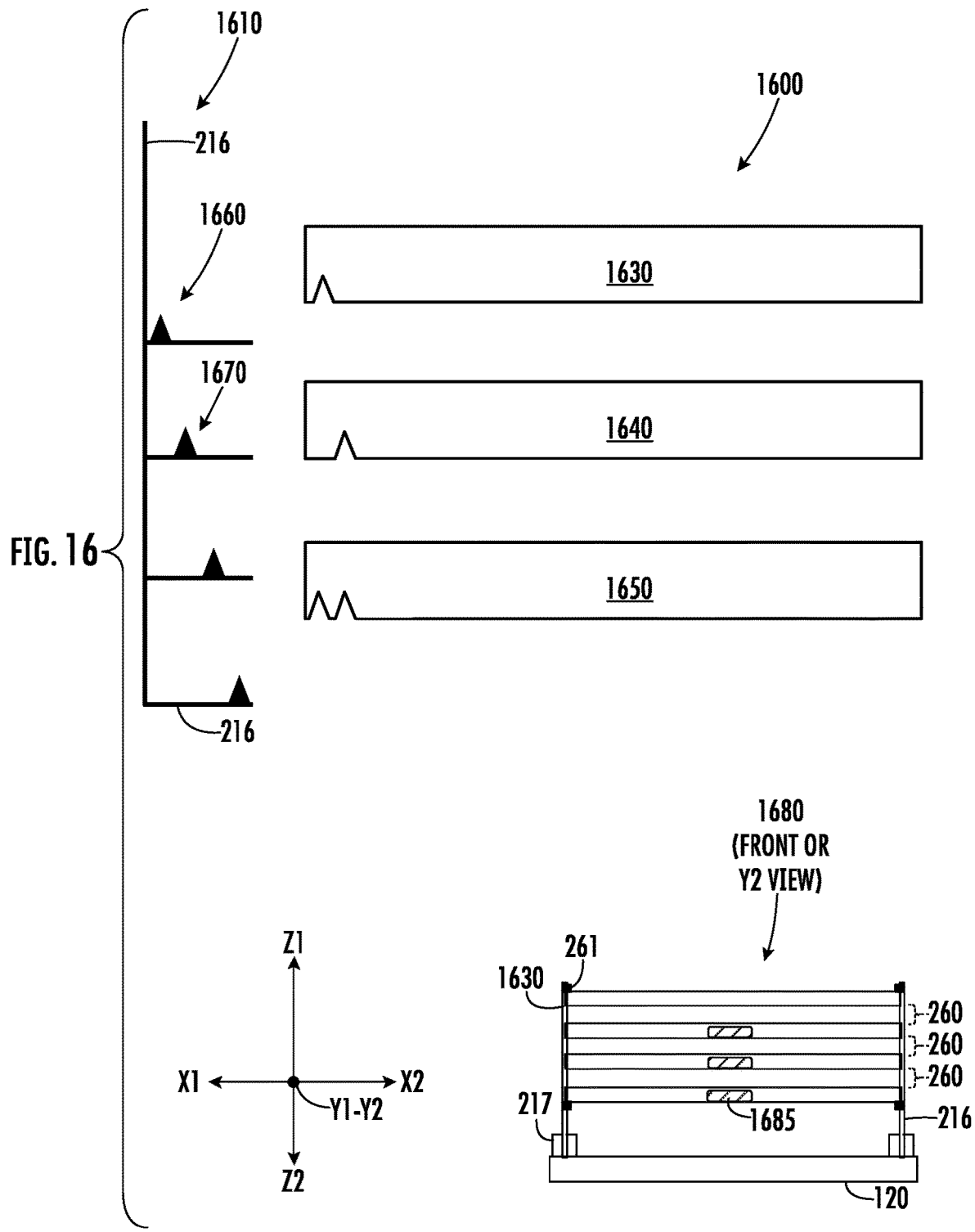
FIG. 16 depicts a diagram of a frame, as well as a module loading operation of inserting one or more modules in to the frame, according to one or more embodiments.

FIG. 16 depicts a diagram 1600 of a frame 1610, as well as a module loading operation (inserting one or more modules 1620, 1630, and 1640), according to one or more embodiments. In this regard, the diagram 1600 shows the frame 110 includes the arm 216 and one or more support members 516. Further, the one or more support members 566 are keyed, ensuring that a particular module can only be inserted into a proper position within the frame 1650. As shown, a module 1620 is keyed for a position 1660, a module 1630 is keyed for a position 1670, and a module 1650 is keyed for positions 1660 and 1670. Note that any connectors can be keyed as well or in the alternative, such as by filling a hole or providing a peg, to ensure proper connections. FIG. 16 also depicts diagram 1680 of a frame 1610 according to one or more embodiments. In the diagram 1680, a single module 1630 has been inserted into the position 1660. Further, as no modules are in the remaining positions of the frame 1610, corresponding connector 1685 (e.g., via a pre-wired receptacle, a pin connection, a pig tail connection, or the like) that electrically couples any modules adapted to that position within the frame 1610 are shown.

According to one or more embodiments, the connector 1685 includes hard wired electrical connections, such as combiner box connections that provide outlets, PCI connections, or the like for receiving modules. Note that the hard wired electrical connections can contain sensors (e.g., the sensors 736 of FIG. 7), and the hard wired electrical connections can join wiring from separate modules. For example, each wiring harnesses of a module 1630 can protrude to a backside of each outlet to make installation, repairs, and maintenance easy (e.g., in a plug and play fashion). These hard wired electrical connections and outlets can be weatherproof quick connection hardware (e.g., used to connect wires to combiner boxes or one or more boxes 370 of FIG. 3 to simplify installation and reduce field quality errors). Fuses with in-use indication lights can be included with each hard wired electrical connection to ensure the modules are de-energized during installation and maintenance.

Figure 17:
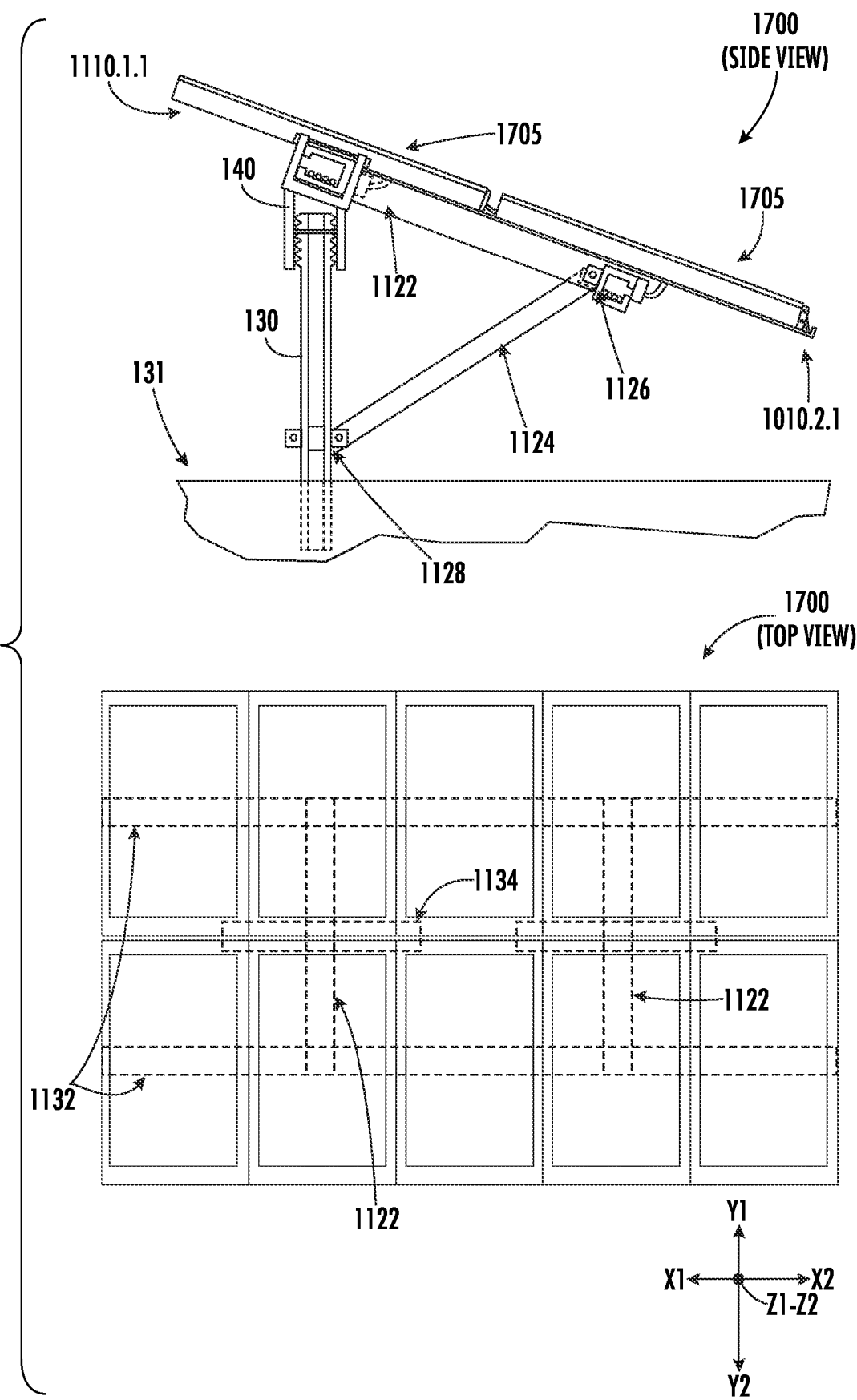
FIG. 17 depicts a system according to one or more embodiments.

FIG. 17 depicts a system 1700 according to one or more embodiments. The system 1700 is an example of the solar module racking system as described herein and is shown from a side view and a perspective view. Note that, by way of example in conjunction with the other drawings, like reference numerals in the figures indicate like elements and will not be reintroduced for brevity. The diagram of FIG. 17 is oriented according to an X1-X2 axis, a Y1-Y2 axis, and Z1-X2 axis. The X1-X2 axis, as represented as a dot/circle, axis is generally oriented into and out of the page or normal to a Y-Z plane. The Y1-Y2 axis is generally oriented in a direction normal to an X-Z plane. The Z1-Z2 axis is generally oriented in a direction normal to an X-Y plane. The X1 direction is opposite the X2 direction, the Y1 direction is opposite the Y2 direction, and the Z1 direction is opposite the Z2 direction. Other orientations can be made in accordance with these axes, which may be tilted or angled. References to a side or a surface of a component can be described in accordance with these axes. For instance, a reference to a lower or bottom side or a downwardly facing surface of a component described may be referred to as a Z2 side or a Z2 surface.

The system 1700 receives, from at least the sun 101 (from the Y1-Z1 direction), the light 102 at a plurality of solar modules 1705. The system 1700 includes a post 130 mounted to a surface (i.e., a ground 131), and a cap 140. The system 1700 includes a frame, a framework, or a stacking structure, e.g., shown as a plurality of frames 1710 and a beam arrangement 1720.

The beam arrangement 1720 can include at least one beam of the beam arrangement 120, such as square beams, round beams, I-beams, or other structural member with variable angles. For instance, the beam arrangement 1720 can include a structure beam 1722, a support beam 1724, a lateral support beam 1726, a lateral support beam 1727, and an adjustable bracket 1730 that can be affixed at any height on the post to result angling the plurality of solar modules 1705.

Figure 18:
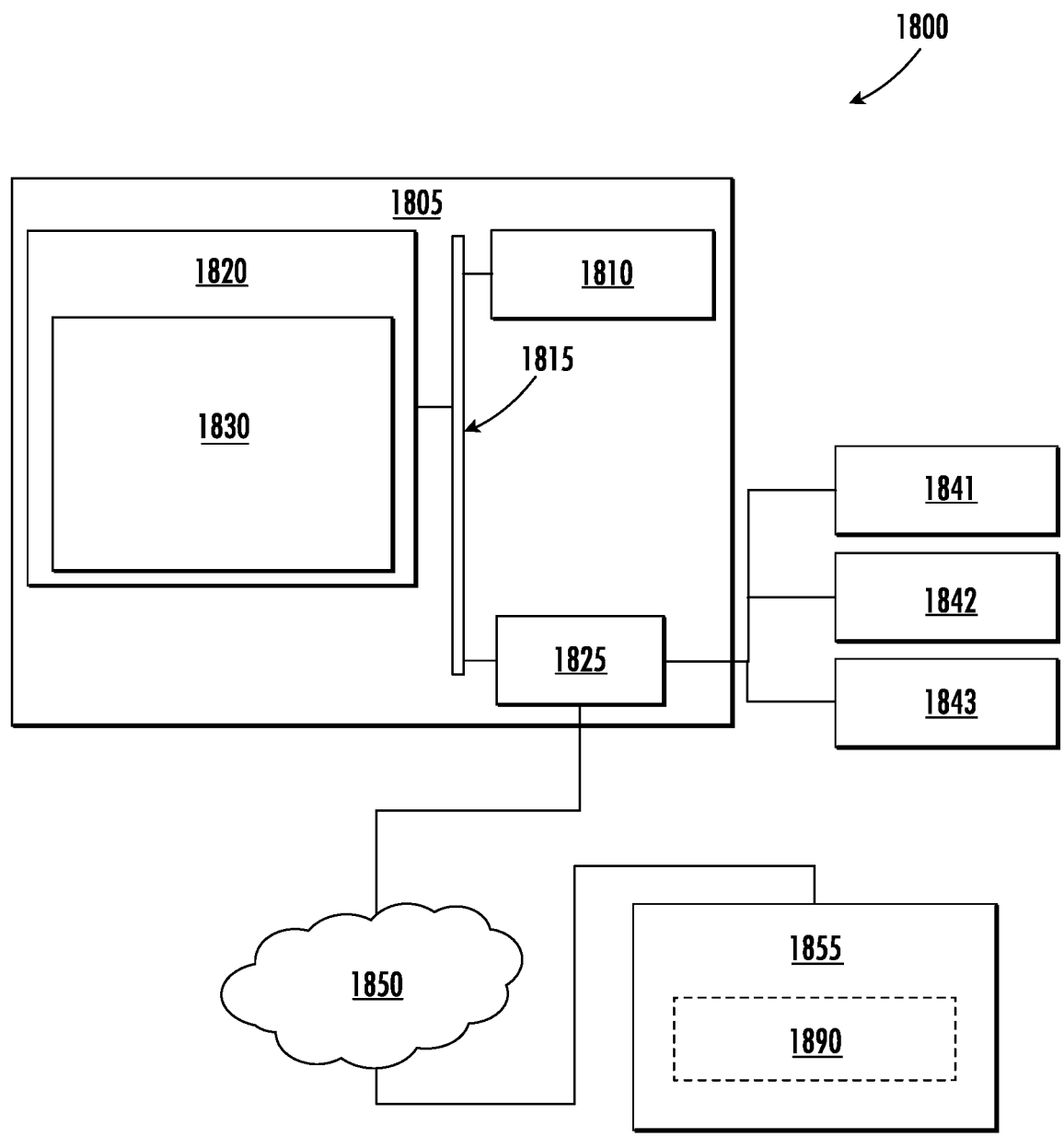
FIG. 18 depicts a system according to one or more embodiments.

According to one or more Turning now to FIG. 18, a computing system 1800 is illustrated according to one or more embodiments. The computing system 1800 can be representative of any computing device, computing apparatus, and/or computing environment, which include hardware, software, or a combination thereof. Further, embodiments of the computing system 1800 disclosed may include apparatuses, systems, methods, and/or computer program products at any possible technical detail level of integration. In general, the computing system 1800 of FIG. 18 operates to monitor at least the environment 700 of FIG. 7 and components therein. For instance, the computing system 1800 can detect anomalies, degradations, operations, and the like to, as well as coordinate with other systems and data of those systems (e.g., weather data), to accept, process, and extrapolate (e.g., using big data operations with respect to machine learning and artificial intelligence) at least a health of the device 760 of FIG. 7 and components therein.

The computing system 1800 has a device 1805 (e.g., the device 760 of FIG. 7) with one or more central processing units (CPU(s)), which are collectively or generically referred to as a processor 1810. The processor 1810, also referred to as processing circuits, is coupled via a system bus 1815 to a system memory 1820 and various other components. The computing system 1800 and/or the device 1805 may be adapted or configured to perform as an online platform, a server, an embedded computing system, a personal computer, a console, a personal digital assistant (PDA), a cell phone, a tablet computing device, a quantum computing device, cloud computing device, a mobile device, a smartphone, a fixed mobile device, a smart display, a wearable computer, or the like.

The processor 1810 may be any type of general or specific purpose processor, including a central processing unit (CPU), application specific integrated circuit (ASIC), field programmable gate array (FPGA), graphics processing unit (GPU), controller, multi-core processing unit, three dimensional processor, quantum computing device, or any combination thereof. The processor 1810 may also have multiple processing cores, and at least some of the cores may be configured to perform specific functions. Multi-parallel processing may also be configured. In addition, at least the processor 1810 may be a neuromorphic circuit that includes processing elements that mimic biological neurons.

The system bus 1815 (or other communication mechanism) is configured for communicating information or data to the processor 1810, the system memory 1820, and various other components, such as an adapter 1825.

The system memory 1820 is an example of a (non-transitory) computer readable storage medium, where software 1830 can be stored as software components, modules, engines, instructions, or the like for execution by the processor 1810 to cause the device 1805 to operate, such as described herein. The system memory 1820 can include any combination of a read only memory (ROM), a random access memory (RAM), internal or external Flash memory, embedded static-RAM (SRAM), solid-state memory, cache, static storage such as a magnetic or optical disk, or any other types of volatile or non-volatile memory. Non-transitory computer readable storage mediums may be any media that can be accessed by the processor 1810 and may include volatile media, non-volatile media, or the like. For example, the ROM is coupled to the system bus 1815 and may include a basic input/output system (BIOS), which controls certain basic functions of the device 1805, and the RAM is read-write memory coupled to the system bus 1815 for use by the processors 1810. Non-transitory computer readable storage mediums can include any media that is removable, non-removable, or the like.

According to one or more embodiments, the software 1830 can be configured in hardware, software, or a hybrid implementation. The software 1830 can be composed of modules that are in operative communication with one another, and to pass information or instructions. According to one or more embodiments, the software 1830 can provide one or more user interfaces, such as on behalf of the operating system or other application and/or directly as needed. The user interfaces include, but are not limited to, graphic user interfaces, window interfaces, internet browsers, and/or other visual interfaces for applications, operating systems, file folders, and the like. Thus, user activity can include any interaction or manipulation of the user interfaces provided by the software 1830. The software 1830 can further include custom modules to perform application specific processes or derivatives thereof, such that the computing system 1800 may include additional functionality. For example, according to one or more embodiments, the software 1830 may be configured to store information, instructions, commands, or data to be executed or processed by the processor 1810 to logically implement the methods described herein (e.g., big data operations with respect to machine learning and artificial intelligence). The software 1830 of FIG. 18 can also be representative of an operating system, a mobile application, a client application, and/or the like for the device 1805 for the computing system 1800.

The adapter 1825 can be representative of one or more adapters of the device 1805, such as an input/output (I/O) adapter, a device adapter, and/or a communications adapter. According to one or more embodiments, the adapter 1825 may be connected to one or more I/O buses that are connected to the system bus 1815 via an intermediate bus bridge. Suitable I/O buses for connecting peripheral devices such as hard disk controllers, network adapters, and graphics adapters typically include common protocols, such as the Peripheral Component Interconnect (PCI).

According to one or more embodiments, the I/O adapter can be configured as a small computer system interface (SCSI), of in view of frequency division multiple access (FDMA) single carrier FDMA (SC-FDMA), time division multiple access (TDMA), code division multiple access (CDMA), orthogonal frequency-division multiplexing (OFDM), orthogonal frequency-division multiple access (OFDMA), global system for mobile (GSM) communications, general packet radio service (GPRS), universal mobile telecommunications system (UMTS), cdma2000, wideband CDMA (W-CDMA), high-speed downlink packet access (HSDPA), high-speed uplink packet access (HSUPA), high-speed packet access (HSPA), long term evolution (LTE), LTE Advanced (LTE-A), 802.11x, Wi-Fi, Zigbee, Ultra-WideBand (UWB), 802.16x, 802.15, home Node-B (HnB), Bluetooth, radio frequency identification (RFID), infrared data association (IrDA), near-field communications (NFC), fifth generation (5G), new radio (NR), or any other wireless or wired device/transceiver for communication.

According to one or more embodiments, the device adapter interconnects input/output devices to the system bus 1815, such as a display 1841, a sensor 1842, a controller 1843, or the like (e.g., a camera, a speaker, etc.).

The display 1841 is configured to provide one or more UIs or graphic UIs (GUIs) that can be captured by and analyzes by the software 1830, as the users interacts with the device 1805. Examples of the display 1841 can include, but are not limited to, a plasma, a liquid crystal display (LCD), a light emitting diode (LED), a field emission display (FED), an organic light emitting diode (OLED) display, a flexible OLED display, a flexible substrate display, a projection display, a 4K display, a high definition (HD) display, a Retina© display, an in-plane switching (IPS) display or the like. The display 1841 may be configured as a touch, three dimensional (3D) touch, multi-input touch, or multi-touch display using resistive, capacitive, surface-acoustic wave (SAW) capacitive, infrared, optical imaging, dispersive signal technology, acoustic pulse recognition, frustrated total internal reflection, or the like as understood by one of ordinary skill in the art for input/output (I/O).

The sensor 1842, such as any transducer configured to convert one or more environmental conditions into an electrical signal, may be further coupled to the system bus 1815 for input to the device 1805. In addition, one or more inputs may be provided to the computing system 1800 remotely via another computing system (e.g., the computing system 1855) in communication therewith, or the device 1805 may operate autonomously. For example, the sensor 1842 can include one or more of an electrode, a temperature sensor (e.g., thermocouple), a current sensor, a photosensor, an accelerometer, a microphone, a radiation sensor, a proximity sensor, position sensor, and a long range (LoRa) sensor (e.g., any low-power wide-area network modulation sensor). According to one or more embodiments, the sensors 1842 can be installed at each level and integrated into an environment (e.g., the sensors 736 of the environment 700 of FIG. 7) to monitor operations therein, such as identify when a specific module (e.g., the module 732 of the environment 700 of FIG. 7) is not functioning correctly. For example. when a module's electric current falls below a defined threshold, the sensors 1842 (e.g., electric current sensors) send a signal to the software 1830 to identify a malfunctioning module's exact location. Each sensor 1842 includes a serial number that can be matched with each modules/modular apparatuses/frames/etc. (e.g., as identified on a scannable code) and corresponding level of the environment (e.g., the environment 700 of FIG. 7).

The controller 1843, such as a computer mouse, a touchpad, a touch screen, a keyboard, a keypad, or the like, may be further coupled to the system bus 1815 for input to the device 1805. In addition, one or more inputs may be provided to the computing system 1800 remotely via another computing system (e.g., the computing system 1855) in communication therewith, or the device 1805 may operate autonomously. The controller 1843 can also be representative of one or more actuators or the like for moving, locking, unlocking portions of the environment (e.g., the environment 700 of FIG. 7).

According to one or more embodiments, the communications adapter interconnects the system bus 1815 with a network 1850, which may be an outside network, enabling the device 1805 to communicate data with other such devices (e.g., such a computing system 1855 through the network 1850).

According to one or more embodiments, the functionality of the device 1805 with respect to the software 1830 can also be implemented on the computing system 1855, as represented by separate instances of the software 1830. Note that the software 1830 can be stored in a common repository located at the device 1805 and/or the computing system 1855 and can be downloaded (on demand) to and/or from each of the device 1805 and/or the computing system 1855.

According to one or more embodiments, a solar module racking system including a frame. The frame includes a plurality of pre-wired receptacles for rapid assembly of a plurality of solar modules. The frame receives and mechanically supports each module of the plurality of solar modules. The frame arranges the plurality of solar modules in a first planar direction, in a second planar direction, and in a vertical direction that is normal to the first and second planar directions. Each of plurality of pre-wired receptacles individually and electrically connect each of the plurality of solar modules after insertion of that module into the frame. The solar module racking system provides at least a 2 by 1 by 1 configuration or a 1 by 2 by 1 configuration for the plurality of solar modules corresponding to the first planar direction, the second planar direction, and the vertical direction. A first module and a second module are arranged in the first planar direction or the second planar direction, respectively.

According to one or more embodiments or any of the solar module racking systems herein, the solar module racking system can include a beam arrangement including at least one beam and configured to support the frame.

According to one or more embodiments or any of the solar module racking systems herein, the solar module racking system can include a post mounted to a surface; and a cap mechanically coupled to the post and configured to accept the beam arrangement.

According to one or more embodiments or any of the solar module racking systems herein, the beam arrangement can support the frame and at least one second frame to provide at least a 2 by 1 by 2 configuration or at least a 1 by 2 by 2 configuration for the plurality of solar modules where at least a third module and is arranged in the vertical direction with respect to the first module and the second module.

According to one or more embodiments or any of the solar module racking systems herein, the frame can receive a top loading of the plurality of solar modules.

According to one or more embodiments or any of the solar module racking systems herein, the frame can include one or more arms, each arm of the one or more arms being configured to minimize internal shading onto the plurality of solar modules.

According to one or more embodiments or any of the solar module racking systems herein, the frame can include a slot and shelving system, a rail clamp system, a snap button and slot system, or a tracking system for receiving the plurality of solar modules.

According to one or more embodiments or any of the solar module racking systems herein, the frame can be sealed by a perimeter mold along an outer edge of the each of the first and second modules.

According to one or more embodiments or any of the solar module racking systems herein, the frame can be sealed on a perimeter of the first and second modules by a screen, a water tight membrane, or an air filter.

According to one or more embodiments or any of the solar module racking systems herein, the frame can include a flange configured to mechanically support the plurality of solar modules; a tongue extending in the vertical direction from the frame; and a grooved clamp configured to fit onto the flange and secure the plurality of solar modules in the mechanically stacked vertical direction.

According to one or more embodiments, a solar module racking system including a frame. The frame includes a plurality of pre-wired receptacles for rapid assembly of a plurality of solar modules. The frame receives and mechanically supports each module of the plurality of solar modules. The frame arranges the plurality of solar modules in a first planar direction, in a second planar direction, and in a vertical direction that is normal to the first and second planar directions. Each of plurality of pre-wired receptacles individually and electrically connect each of the plurality of solar modules after insertion of that module into the frame. The solar module racking system provides at least a 1 by 1 by 2 configuration for the plurality of solar modules corresponding to the first planar direction, the second planar direction, and the vertical direction where at least a first module and a second module are arranged and mechanically stacked in the vertical direction.

According to one or more embodiments or any of the solar module racking systems herein, the solar module racking system can include a beam arrangement including at least one beam and configured to support the frame.

According to one or more embodiments or any of the solar module racking systems herein, the solar module racking system can include a post mounted to a surface; and a cap mechanically coupled to the post and configured to accept the beam arrangement.

According to one or more embodiments or any of the solar module racking systems herein, the beam arrangement can support the frame and at least one second frame to provide at least a 2 by 1 by 2 configuration or at least a 1 by 2 by 2 configuration for the plurality of solar modules where at least a third module and is arranged in the first planar direction or the second planar direction with respect to the first module and the second module.

According to one or more embodiments or any of the solar module racking systems herein, the frame can receive a top loading of the plurality of solar modules.

According to one or more embodiments or any of the solar module racking systems herein, the frame can include one or more arms, each arm of the one or more arms being configured to minimize internal shading onto the plurality of solar modules.

According to one or more embodiments or any of the solar module racking systems herein, the frame can include a slot and shelving system, a rail clamp system, a snap button and slot system, or a tracking system for receiving the plurality of solar modules.

According to one or more embodiments or any of the solar module racking systems herein, the frame can be sealed by a perimeter mold along an outer edge of the each of the mechanically stacked first and second modules.

According to one or more embodiments or any of the solar module racking systems herein, the frame can be sealed on a perimeter of the first and second modules by a screen, a water tight membrane, or an air filter.

According to one or more embodiments or any of the solar module racking systems herein, the frame can include a flange configured to mechanically support the plurality of solar modules; a tongue extending in the vertical direction from the frame; and a grooved clamp configured to fit onto the flange and secure the first and second modules in the mechanically stacked vertical direction.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. A computer readable medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Examples of computer-readable media include electrical signals (transmitted over wired or wireless connections) and computer-readable storage media. Examples of computer-readable storage media include, but are not limited to, a register, cache memory, semiconductor memory devices, magnetic media such as internal hard disks and removable disks, magneto-optical media, optical media such as compact disks (CD) and digital versatile disks (DVDs), a random access memory (RAM), a read-only memory (ROM), an erasable programmable read-only memory (EPROM or Flash memory), a static random access memory (SRAM), and a memory stick. A processor in association with software may be used to implement a radio frequency transceiver for use in a terminal, base station, or any host computer.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A solar module racking system comprising:
   a frame comprising a plurality of pre-wired receptacles for rapid assembly of a plurality of solar modules, the frame being configured to receive and mechanically support each module of the plurality of solar modules, the frame being configured to arrange the plurality of solar modules in a first planar direction, in a second planar direction, and in a vertical direction that is normal to the first and second planar directions, and each of plurality of pre-wired receptacles individually and electrically connect each of the plurality of solar modules after insertion of that module into the frame,
   wherein the solar module racking system provides at least a 1 by 1 by 2 configuration for the plurality of solar modules corresponding to the first planar direction, the second planar direction, and the vertical direction where at least a first module and a second module are arranged and mechanically stacked in the vertical direction,
   wherein the frame configured to top load and secure the first and second modules in the mechanically stacked vertical direction.

2. The solar module racking system of claim 1, further comprising:
   a beam arrangement comprising at least one beam and configured to support the frame.

3. The solar module racking system of claim 2, further comprising:
   a post mounted to a surface; and
   a cap mechanically coupled to the post and configured to accept the beam arrangement.

4. The solar module racking system of claim 2, wherein the beam arrangement supports the frame and at least one second frame to provide at least a 2 by 1 by 2 configuration or at least a 1 by 2 by 2 configuration for the plurality of solar modules where at least a third module and is arranged in the first planar direction or the second planar direction with respect to the first module and the second module.

5. The solar module racking system of claim 1, wherein the frame comprises one or more arms, each arm of the one or more arms being configured to minimize internal shading onto the plurality of solar modules.

6. The solar module racking system of claim 1, wherein the frame comprises a slot and shelving system, a rail clamp system, a snap button and slot system, or a tracking system for receiving the plurality of solar modules.

7. The solar module racking system of claim 1, wherein the frame is sealed by a perimeter mold along an outer edge of the each of the mechanically stacked first and second modules.

8. A solar module racking system comprising:
   a frame comprising a plurality of pre-wired receptacles for rapid assembly of a plurality of solar modules, the frame being configured to receive and mechanically support each module of the plurality of solar modules, the frame being configured to arrange the plurality of solar modules in a first planar direction, in a second planar direction, and in a vertical direction that is normal to the first and second planar directions, and each of plurality of pre-wired receptacles individually and electrically connect each of the plurality of solar modules after insertion of that module into the frame,
   wherein the solar module racking system provides at least a 1 by 1 by 2 configuration for the plurality of solar modules corresponding to the first planar direction, the second planar direction, and the vertical direction where at least a first module and a second module are arranged and mechanically stacked in the vertical direction, wherein the frame comprises:
      a bottom extrusion configured to mechanically support the plurality of solar modules;
      a flange extending in the vertical direction from the bottom extrusion; and
      a top extrusion configured to fit onto the flange and secure the first and second modules in the mechanically stacked vertical direction.

9. The solar module racking system of claim 8, further comprising:
   a beam arrangement comprising at least one beam and configured to support the frame.

10. The solar module racking system of claim 9, further comprising:
    a post mounted to a surface; and
    a cap mechanically coupled to the post and configured to accept the beam arrangement.

11. The solar module racking system of claim 9, wherein the beam arrangement supports the frame and at least one second frame to provide at least a 2 by 1 by 2 configuration or at least a 1 by 2 by 2 configuration for the plurality of solar modules where at least a third module and is arranged in the first planar direction or the second planar direction with respect to the first module and the second module.

12. The solar module racking system of claim 8, wherein the frame comprises one or more arms, each arm of the one or more arms being configured to minimize internal shading onto the plurality of solar modules.

13. The solar module racking system of claim 8, wherein the frame comprises a slot and shelving system, a rail clamp system, a snap button and slot system, or a tracking system for receiving the plurality of solar modules.

14. The solar module racking system of claim 8, wherein the frame is sealed by a perimeter mold along an outer edge of the each of the mechanically stacked first and second modules.

* * * * *

UNITED STATES PATENT AND TRADEMARK OFFICE
CERTIFICATE OF CORRECTION

PATENT NO. : 11,894,802 B2
APPLICATION NO. : 17/841239
DATED : February 6, 2024
INVENTOR(S) : Kurt G. Conti and Cullin J. Wible It is certified that error appears in the above-identified patent and that said Letters Patent is hereby corrected as shown below:

On the Title Page

1. On Page 2, in Item (56), under "OTHER PUBLICATIONS", in Column 2, Line 12, delete "Viera" and insert -- Vieira --, therefor.

2. On Page 2, in Item (56), under "OTHER PUBLICATIONS", in Column 2, Line 22, delete "using" and insert -- Using --, therefor.

3. On Page 2, in Item (56), under "OTHER PUBLICATIONS", in Column 2, Line 25, delete "C. Moganapirya" and insert -- C. Moganapriya --, therefor.

In the Drawings

4. In Fig. 4, Sheet 4 of 18, for Tag "401", in Line 4, delete "TRANSMITANCE" and insert -- TRANSMITTANCE --, therefor.

5. In Fig. 4, Sheet 4 of 18, for Tag "401", in Line 5, delete "TRANSMITANCE" and insert -- TRANSMITTANCE --, therefor.

In the Specification

6. In Column 2, Line 32, delete "details" and insert -- detailed --, therefor.

7. In Column 2, Line 35, delete "a" and insert -- of a --, therefor.

8. In Column 2, Line 43, delete "embodiments" and insert -- embodiments; --, therefor.

9. In Column 2, Line 47, delete "in to" and insert -- into --, therefor.

10. In Column 8, Line 42, delete "the can" and insert -- can --, therefor.

Signed and Sealed this
Ninth Day of April, 2024

Katherine Kelly Vidal
*Director of the United States Patent and Trademark Office*

11. In Column 12, Line 46, delete "details" and insert -- detailed --, therefor.

12. In Column 13, Line 24, delete "that that" and insert -- that --, therefor.

13. In Column 13, Line 61, delete "placed" and insert -- is placed --, therefor.

14. In Column 14, Line 17, delete "be support" and insert -- support --, therefor.

15. In Column 18, Line 19, delete "example." and insert -- example, --, therefor.